United States Patent
Sasaki et al.

[11] Patent Number: 5,770,466
[45] Date of Patent: Jun. 23, 1998

[54] SEMICONDUCTOR OPTICAL INTEGRATED CIRCUITS AND METHOD FOR FABRICATING THE SAME

[75] Inventors: Tatsuya Sasaki; Mitsuhiro Kitamura; Kiichi Hamamoto; Shotaro Kitamura; Keiro Komatsu; Yasutaka Sakata, all of Tokyo, Japan

[73] Assignee: NEC Corporation, Tokyo, Japan

[21] Appl. No.: 400,570

[22] Filed: Mar. 8, 1995

Related U.S. Application Data

[62] Division of Ser. No. 179,049, Jan. 7, 1994.

[30] Foreign Application Priority Data

| Jan. 7, 1993 | [JP] | Japan | 5-914 |
| Jun. 25, 1993 | [JP] | Japan | 5-154040 |
| Jun. 25, 1993 | [JP] | Japan | 5-154042 |
| Dec. 28, 1993 | [JP] | Japan | 5-337967 |

[51] Int. Cl.$^6$ .................................................. H01L 21/20
[52] U.S. Cl. .............................. 437/89; 437/110; 437/129
[58] Field of Search ..................... 437/129, 110, 437/89

[56] References Cited

U.S. PATENT DOCUMENTS

| 4,961,198 | 10/1990 | Ishino et al. . | |
| 5,250,462 | 10/1993 | Sasaki et al. | 437/89 |
| 5,284,791 | 2/1994 | Sakata et al. | 148/DIG. 95 |
| 5,347,526 | 9/1994 | Suzuki et al. | 372/20 |
| 5,358,896 | 10/1994 | Komatsu et al. | 437/89 |
| 5,384,797 | 1/1995 | Welch et al. | 372/23 |
| 5,432,123 | 7/1995 | Dentai et al. | 437/110 |
| 5,436,195 | 7/1995 | Kimura et al. | 437/129 |
| 5,450,437 | 9/1995 | Shim et al. | 372/96 |

FOREIGN PATENT DOCUMENTS

| 0 472 221 | 2/1992 | European Pat. Off. . |
| 0 501 751 | 9/1992 | European Pat. Off. . |
| 100291 | 4/1992 | Japan . |
| 105383 | 4/1992 | Japan . |
| 243216 | 8/1992 | Japan . |
| 303982 | 10/1992 | Japan . |
| 369269 | 12/1992 | Japan . |
| 82909 | 4/1993 | Japan . |
| 327112 | 12/1993 | Japan . |

OTHER PUBLICATIONS

Colas et al., E., "In Situ Definition of Semiconductor Structures by Selective Area Growth and Etching", *Applied Physic Letters*, Oct. 14, 1991, vol. 59, No. 16, pp. 2019–2021.

(List continued on next page.)

*Primary Examiner*—Robert Kunemund
*Attorney, Agent, or Firm*—Young & Thompson

[57] ABSTRACT

A semiconductor optical monolithic integration device has a semiconductor substrate including an active region and a passive region. Epitaxial layers including a multiple quantum well structure have a variation in band gap energy and thickness along a waveguide direction. The epitaxial layers in the active region are selectively grown by a metal organic vapor phase epitaxy on a first selective growth area defined by a first mask pattern provided in the active region except in the passive region. The first mask pattern has a variation in width along the waveguide direction. The epitaxial layers are simultaneously and non-selectively grown on an entire surface of the passive region by the metal organic vapor phase epitaxy and the epitaxial layers have a mesa structure in the active region and a plane structure in the passive region. A cladding layer having a ridged structure is selectively grown by a metal organic vapor phase epitaxy on a second selective growth area defined by a second mask pattern provided in the active and passive regions. The second mask pattern has a constant width. In the active region, the ridged cladding layer completely embeds the mesa structure epitaxial layers and in the passive region the ridged cladding layer are provided on the plane structure epitaxial layers.

28 Claims, 21 Drawing Sheets

OTHER PUBLICATIONS

Yamaguchi et al., M., "Semiconductor Photonic Integrated Circuit for High–Density WDM Light Source", *K–1*, pp. 160–161, 12$^{th}$ IEEE Int'l Semiconductor Conference.

Murata et al., S., "Over 720 GHz (5•8nm) Frequency Tuning by A 1•5 μm DBR Laser with Phase and Bragg Wavelength Control Regions", *Electronic Letters*, Apr. 9, 1987, vol. 23, No. 8, pp. 403–405.

Koren et al., U., "Wavelength Division Multiplexing Light Source with Integrated Quantum Well Tunable Lasers and Optical Amplifiers", *Appl. Phys. Lett.*, May 22, 1989, vol. 54, No. 21, pp. 2056–2058.

Hernandez–Gil et al., F., "Tunable MQW–DBR Laser with Monolithically Integrated GaInAsP/InP Directional Coupler Switch", *Electronic Letters*, Sep. 14, 1989, vol. 25, No.19, pp. 1271–1272.

Takeuchi et al., H., "Monolithic Integrated Coherent Receiver on InP Substrate", *IEEE Photonics Technology Letters*, Nov. 1989, vol. 1, No. 11, pp. 398–400.

Aoki et al., M., "Novel Structure MQW Electroabsorption Modulator/DFB–Laser Integrated Device Fabricated by Selective Area MOCVD Growth", *Electronic Letters*, Nov. 7, 1991, vol. 27, No. 23, pp. 2138–2140.

Kato et al., T., "DFB–LD/Modulator Integrated Light Source by Bandgap Energy Controlled Selective MOVPE", Reprinted from *Electronic Letters*, Jan. 16, 1992, vol. 28, No. 2, pp. 153–154.

Janson et al., M., "Monolithically Integrated 2×2 InGaAsP/InP Laser Amplifier Gate Switch Arrays", *Electronic Letters*, Apr. 9, 1992, vol. 28, No. 8, pp. 776–778.

Zah et al., C., "1•5 μm Compressive–Strained Multiquantum–Well 20–Wavelength Distributed–Feedback Laser Arrays", *Electronic Letters*, Apr. 23, 1992, vol. 28, No. 9, pp. 824–825.

Tanbun–Ek et al., T., "DFB Lasers with Monolithically Integrated Passive Waveguide", *IEEE Photonics Technology Letters*, Jul., 1992, vol. 4, No. 7, pp. 685–688.

Zah et al., C., "Monolithic Integration of Multiwavelength Compressive–Strained Multiquantum–Well Distributed–Feedback Laser Array with Star Coupler and Optical Amplifiers", *Electronic Letters*, Dec. 3, 1992, vol. 28, No. 25, pp. 2361–2362.

T. Sasaki et al., "Monolithically integrated multi–wavelength MQW–DBR laser diodes fabricated by selective metalorganic vapor phase epitaxy," Journal of Crystal Growth 145 (1994) pp. 846–851.

T. Kato et al., "DFB–LD/Modulator Integrated Light Source by Bandgap Energy Controlled Selective MOVPE," Electronics Letters, vol. 28, pp. 153–154, 16 Jan. 1992.

☐ InP   ▨ 1.3 m GaInAsP   ▨ 1.55 m GaInAsP

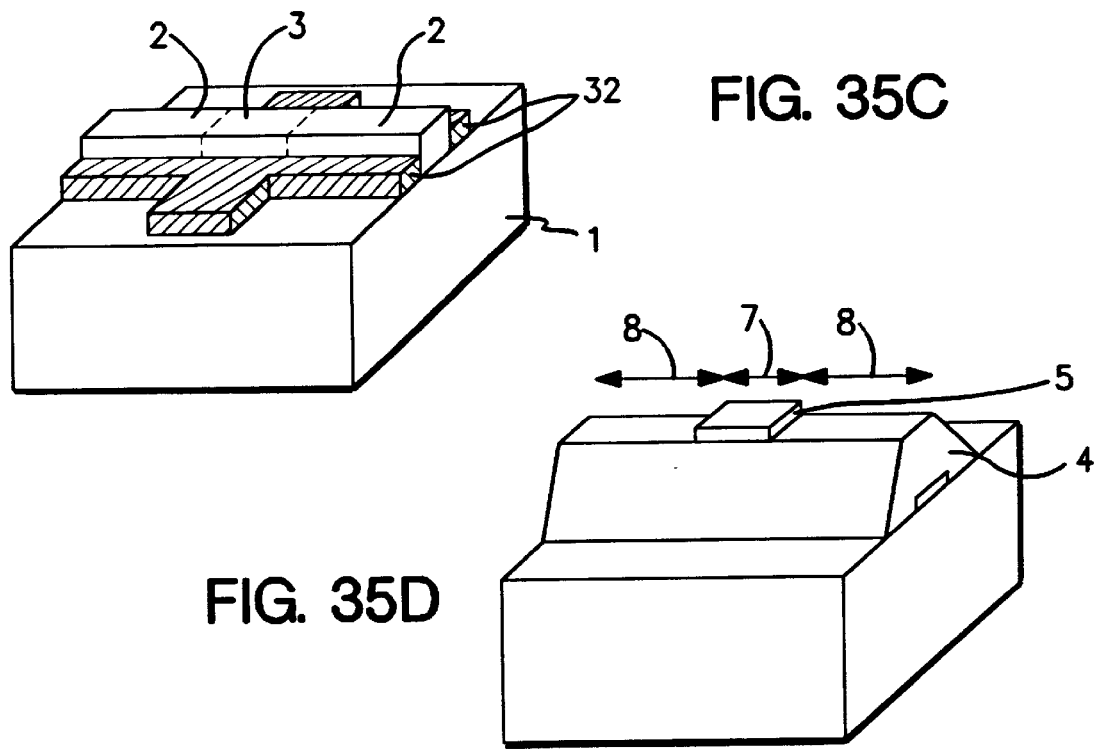
FIG. 35C
FIG. 35D
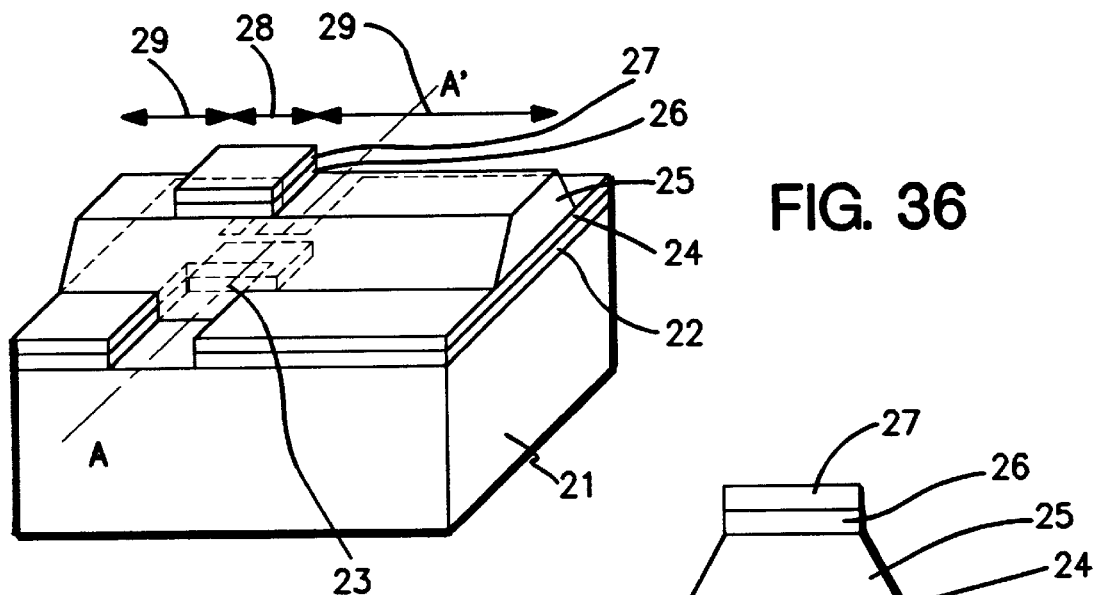
FIG. 36
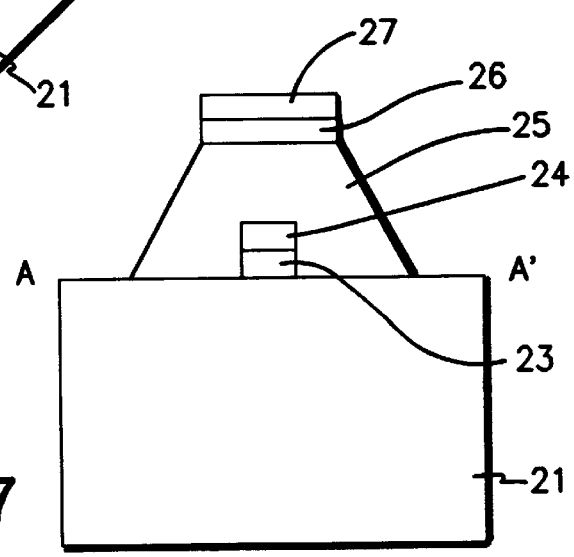
FIG. 37

SEMICONDUCTOR OPTICAL INTEGRATED CIRCUITS AND METHOD FOR FABRICATING THE SAME

This application is a division of application Ser. No. 08/179,049, filed Jan. 7, 1994, pending.

BACKGROUND OF THE INVENTION

1. Field of the Invention

The invention relates to a semiconductor optical integrated circuit device and a method for fabricating the same by utilizing a metal organic vapor phase epitaxy with a waveguide direction band gap energy control technique.

2. Description of the Related Art

The value and importance of developments in fabrication processes of monolithic integration optical devices for multiple channel optical communication systems and high speed optical processing are on the increase. It is required to develop useful and simple fabrication processes of the optical monolithic integration devices to secure a high yield and a uniformity in device performances. The monolithic optical integration device generally comprises active and passive regions, both of which have different band gap energies or different wavelength compositions from each other. For that reason, the fabrication processes are necessarily subject to a complication and a difficulty to secure the uniformity in the device performance as well as an inferiority in accuracy in alignment of each element and in device size.

One of the prior arts for fabrication processes of a single wavelength tunable distributed Bragg reflector laser device is disclosed in Japanese laid-open patent application No. 4-150383. As illustrated in FIGS. 1A to 1C, a multiple quantum well layer 5 is grown by a metal organic vapor phase epitaxy with use of paired dielectric stripe masks 20, each of which has different widths between an active region 31 and a phase control region 32 and a distributed Bragg reflector region 33. The width in the active region 31 is larger than that in the other regions 32 and 33. The multiple quantum well layer 5 and a cladding layer 6 are selectively grown on selective growth areas sandwiched between in the paired dielectric stripe masks 20 respectively.

The thicknesses and the photoluminescence peak wavelengths of the epitaxial layers 4, 5, 6 and 7 grown on the selective growth area are proportional to the width of the dielectric stripe mask 20. The band gap energies of the epitaxial layers are inversely proportional to the mask width. For that reason, the epitaxial layers having the different band gap energies, different wavelength compositions and different thicknesses are grown by a single growths process. Such simplicity in the fabrication process is able to provide a high yield and a uniformity in the device performances.

The above prior art, however, neither discloses nor suggests any useful fabrication processes for monolithic optical integration devices, although it provides a useful fabrication process for a single element involved in the optical integrated circuits.

Another prior art directed to fabrication processes for a single wavelength tunable distributed Bragg reflector laser device is disclosed in Japanese laid-open patent application No. 4-303982 (application No.3-67498). In this prior art, the dielectric stripe masks whose width is varied are used for the selective growth with the metal organic vapor phase epitaxy. This prior art also neither discloses nor suggests any useful fabrication processes for monolithic optical integration devices, although it provides a useful fabrication process for a single element involved in the optical integrated circuits.

The selective metal organic vapor phase epitaxy utilizing the wave guide direction band gap energy control technique by dielectric stripe masks with a varied width is reported in T. Sasaki et al. Optical Fiber Communication Conference, 1992, pp. 281–282. This prior art also neither discloses nor suggests any useful fabrication processes for monolithic optical integration devices.

One example of the fabrication processes for monolithic integrations with lasers and modulators is disclosed in M. Aoki at al. Electronics Letters, 1991, vol. 27, pp. 2138–2140. In this prior art, the fabrication processes for the optical integration device includes mesa etching process as illustrated in FIGS. 2A to 2C. The mesa etching process and any etching process complicate the fabrication process of the device and cause any variation in the layer size thereby resulting in a difficulty to secure a uniformity of the device performance and in a reduction of a yield of the device.

Other prior arts directed to the fabrication process for a semiconductor optical amplifier with a window region are disclosed in I. Cha et al., 100 C' 89, Kobe, paper 20 C2-2 and in Japanese Laid-open patent application No. 5-37092. The above references neither disclose not suggest useful and simple fabrication process for epitaxial layer having a variation in the band gap energy.

Another prior art directed to the fabrication processes for 4-channel optical integration device is illustrated in FIGS. 4 and 5 is disclosed in M. Yamaguchi et al. 1990, Technical Digest, 12th IEEE International Semiconductor Conference pp. 160–161. The device comprises an active region 31, a phase control region 32, a distributed Bragg reflector region 33, a modulator region and a passive waveguide region 35. The fabrication processes have the complication whereby the monolithic integration device has a butt-joint structure which provides a difficulty to secure a high coupling efficiency between each elements. For that reason, it is difficult to secure a high coupling efficiency between each elements thereby resulting in a large injection current and inferior device performance.

Another prior art directed to the fabrication processes for 20-channel optical integration device including distributed is disclosed in C. E. Zah at al. Electronics Letters, December 1992, vol. 28, No. 25, pp. 2361–2362. The emission light wavelengths are different in 20-channels, as illustrated in FIGS. 6 and 7. The fabrication processes include electron beam exposure for forming gratings of the 20-channels having different grating periods. The formation processes of the different pitch gratings provides a complication in the processes and a difficulty to secure a precise grating pitch thereby resulting in a reduction of device yield and a great manufacturing cost.

Another prior art directed to the fabrication processes for optical amplifier gate switch arrays for multiple channel optical communication systems is disclosed in M. Janson at al. Electronics Letters, vol. 28, 1992, pp. 776–778. The structure of the 2×2 gate arrays is illustrated in FIGS. 8 and 9. The passive and active wave guides are not smoothly coupled, namely the coupling portions between the active and passive wave guide layers have discontinuities cause a reduction of coupling efficiency thereof. The low coupling efficiency requires a large injection current which is undesirable.

In any event, there has been no prior art for useful and simple fabrication methods for semiconductor optical integration devices including epitaxial layers in which each

SUMMARY OF THE INVENTION

Accordingly, it is a primary object of the present invention to provide a novel fabrication process for semiconductor optical integration devices free from the above disadvantages.

It is a further object of the present invention to provide a simple and novel fabrication process for semiconductor optical integration devices.

It is a still further object of the present invention to provide a novel fabrication process for semiconductor optical integration devices, which is able to provide a high yield.

It is yet a further object of the present invention to provide a novel fabrication process for semiconductor optical integration devices, which permits the device to possess excellent performances.

It is another object of the present invention to provide a novel optical integration device which is able to secure uniformities in excellent device performances.

It is still another object of the present invention to provide a novel optical integration device which has a high density integration.

It is yet another object of the present invention to provide a novel optical integration device which shows very precise and excellent performances.

The above and other objects, features and advantages of the present invention will be apparent from the following descriptions.

The present invention provides a novel fabrication process for a monolithic optical integration device including epitaxial layers whose band gap energies are variable in a wave guide direction.

The present invention directed to the fabrication processes utilizes the selective metal organic vapor phase epitaxy with the wave guide direction band gap energy control technique free from any etching process. The variation of the width of the dielectric stripe mask pattern used for the selective metal organic vapor phase epitaxy provides a variation according to the mask width in band gap energy, thickness and photoluminescence wavelength composition for the epitaxial layer.

According to the present invention, a first dielectric stripe mask pattern is selectively formed on a semiconductor device in an active region except in a passive region. The first dielectric stripe mask pattern has different widths in the wave guide direction. Epitaxial layers including a multiple quantum well structure are grown on the semiconductor substrate by the metal organic vapor phase epitaxy with use of the first dielectric stripe mask pattern so that the epitaxial layers including the multiple quantum well structure are selectively grown on a first selective growth area sandwiched by the first dielectric stripe mask pattern in the active area and not selectively grown on an entire of the passive region. After removing the first dielectric stripe mask pattern, a second dielectric stripe mask pattern with a constant width is provided in the active and passive regions. The second dielectric stripe mask pattern defines a second selective growth area which at least completely covers the first growth area. A ridged cladding layer is grown on the epitaxial layers including the multiple quantum well structure by the metal organic vapor phase epitaxy with use of the second dielectric strip mask pattern.

Alternatively, a first dielectric stripe mask pattern is selectively formed on a semiconductor device in an active region except in a passive region. The first dielectric stripe mask pattern has a constant width in the wave guide direction. Epitaxial layers including a multiple quantum well structure are grown on the semiconductor substrate by the metal organic vapor phase epitaxy with use of the first dielectric stripe mask pattern so that the epitaxial layers including the multiple quantum well structure are selectively grown on a first selective growth area sandwiched by the first dielectric stripe mask pattern in the active area and not selectively grown on an entire surface of the passive region. After removing the first dielectric stripe mask pattern, a second dielectric stripe mask pattern with a constant width is provided in the active and passive regions. The second dielectric stripe mask pattern defines a second selective growth area which completely covers the first growth area. A ridged cladding layer is grown on the epitaxial layers including the multiple quantum well structure by the metal organic vapor phase epitaxy with use of the second dielectric strip mask pattern.

Alternatively, a first dielectric stripe mask pattern is selectively formed on a semiconductor device in an active region except in a passive region. The first dielectric stripe mask pattern has different widths in the wave guide direction. Epitaxial layers including a multiple quantum well structure are grown on the semiconductor substrate by the metal organic vapor phase epitaxy with use of the first dielectric stripe mask pattern so that the epitaxial layers including the multiple quantum well structure are selectively grown on a first selective growth area sandwiched by the first dielectric stripe mask pattern in the active area and not selectively grown on an entire surface of the passive region. After removing the first dielectric stripe mask pattern, a second dielectric stripe mask pattern is provided in the active and passive regions. The second dielectric stripe mask pattern defines a second selective growth area in the active region except in passive region. The second selective growth area completely covers the first growth area. A part of a ridged cladding layer is selectively grown on the epitaxial layers including the multiple quantum well structure by the metal organic vapor phase epitaxy with use of the second dielectric strip mask pattern. After removing the second dielectric strip mask pattern, a third dielectric stripe mask pattern is provided in the active and passive regions. The third dielectric stripe mask pattern defines a third selective growth area in the passive region except in the active region. The remaining part of the cladding layer is selectively grown on the epitaxial layers including the multiple quantum well structure by the metal organic vapor phase epitaxy with use of the third dielectric strip mask pattern.

Alternatively, a first dielectric stripe mask pattern is selectively formed on a semiconductor device in an active region except in a passive region. The first dielectric stripe mask pattern has a constant width in the wave guide direction. Epitaxial layers including a multiple quantum well structure are grown on the semiconductor substrate by the metal organic vapor phase epitaxy with use of the first dielectric stripe mask pattern so that the epitaxial layers including the multiple quantum well structure are selectively grown on a first selective growth area sandwiched by the first dielectric stripe mask pattern in the active area and not selectively grown on an entire surface of the passive region. After removing the first dielectric stripe mask pattern, a second dielectric mask pattern is provided in the active and passive regions. The second dielectric mask pattern defines a second selective growth area which completely covers the first growth area. A ridged cladding layer is grown on the epitaxial layers including the multiple quantum well structure by the metal organic vapor phase epitaxy with use of the second dielectric mask pattern.

BRIEF DESCRIPTION OF THE INVENTION

Preferred embodiments according to the present invention will hereinafter fully be described in detail with reference to the accompanying drawings.

FIGS. 35A to 35D are views illustrative of optical amplifier gate switching devices in fabrication steps of a tenth embodiment according to the present invention.

FIG. 36 is a perspective view illustrative of an optical amplifier gate switching device of an eleventh embodiment according to the present invention.

FIG. 37 is a fragmentary cross sectional elevation view illustrative of an optical amplifier gate switching device of an eleventh embodiment according to the present invention.

DESCRIPTION OF THE PREFERRED EMBODIMENTS

Figure 1A:
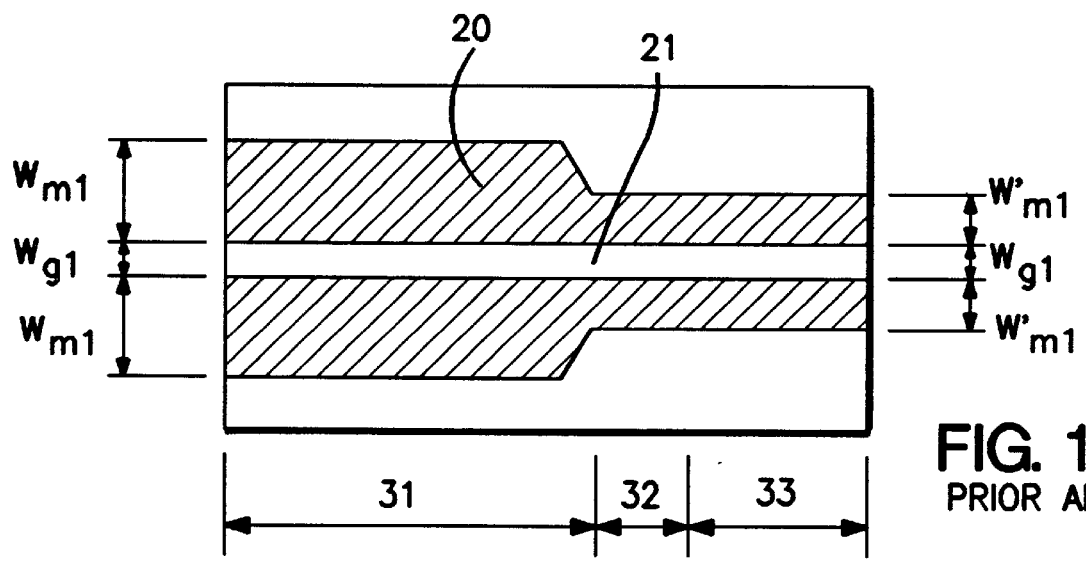
FIGS. 1A and 1B are plane views illustrative of dielectric stripe mask patterns used for fabrication processes of a laser device in the prior art.
Figure 1B:
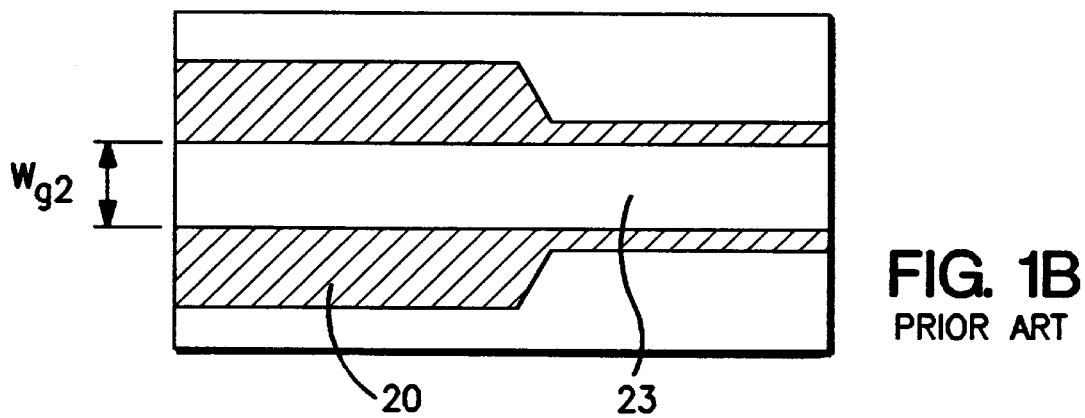
Figure 1C:
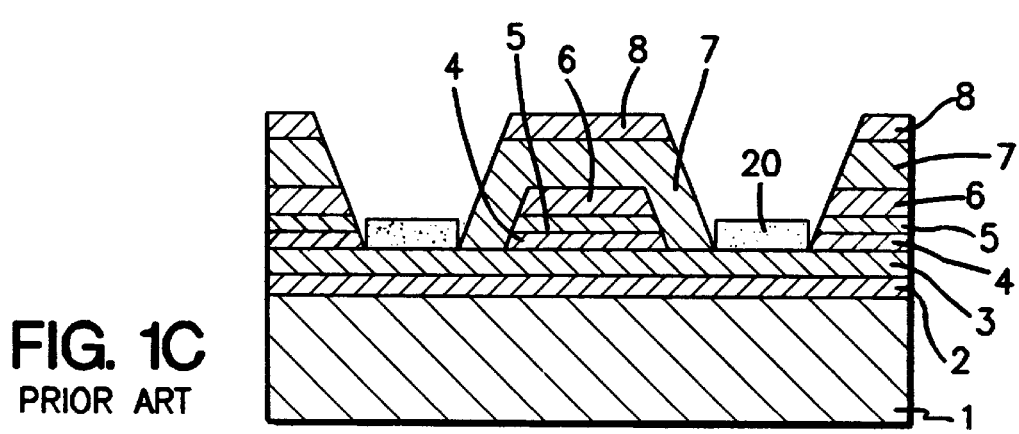
FIG. 1C is a cross sectional elevation view illustrative of a laser device in the prior art.
Figure 2A:
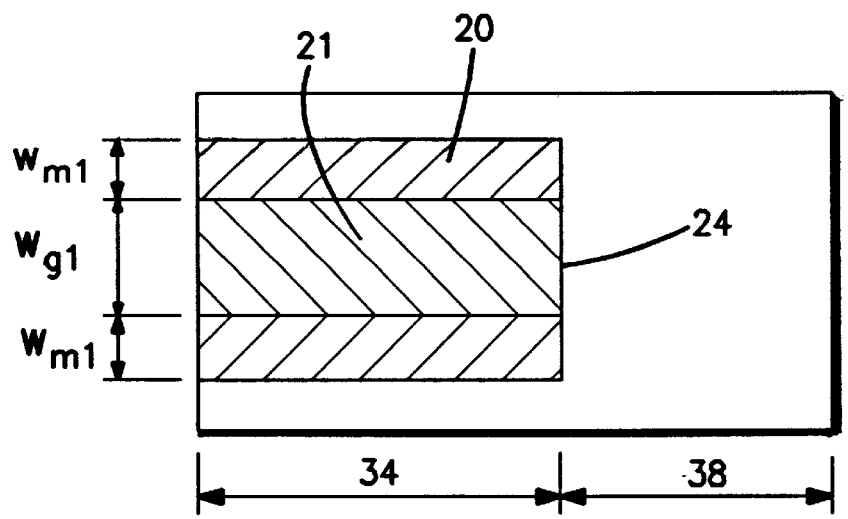
FIGS. 2A and 2B are plane views illustrative of dielectric stripe mask patterns used for fabrication processes of a monolithic integration with a laser device and a modulator in the prior art.
Figure 2B:
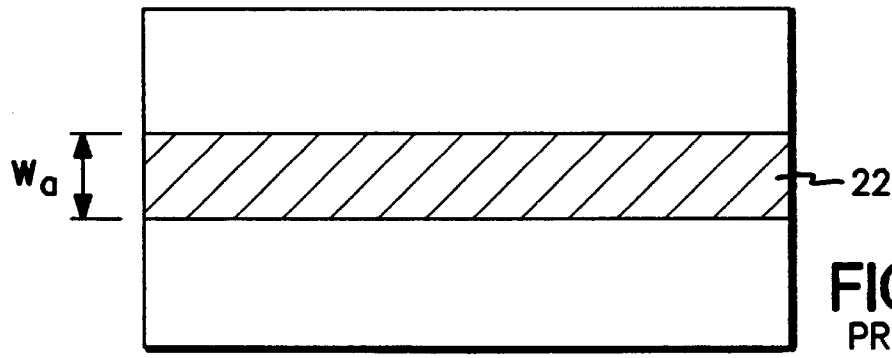
Figure 2C:
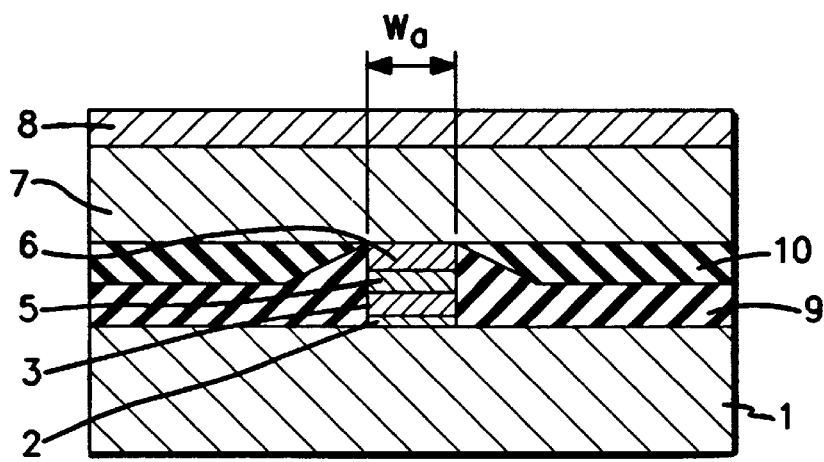
FIG. 2C is a cross sectional elevation view illustrative of a laser device in the prior art.
Figure 3A:
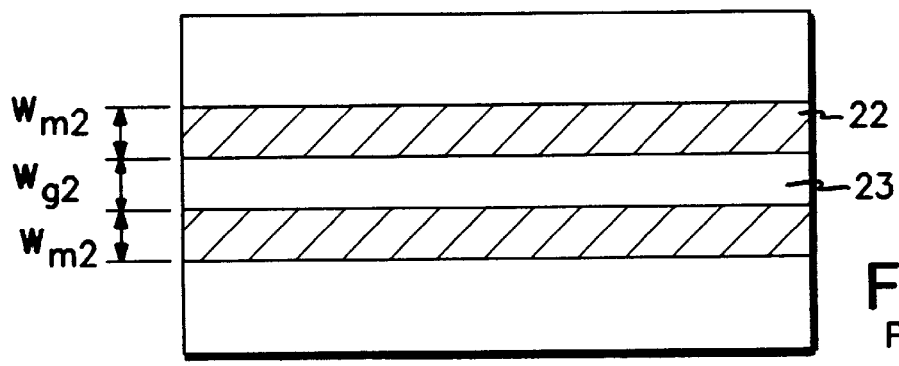
FIG. 3A is a plane view illustrative of a dielectric stripe mask pattern used for a fabrication process of an optical device in the prior art.
Figure 3B:
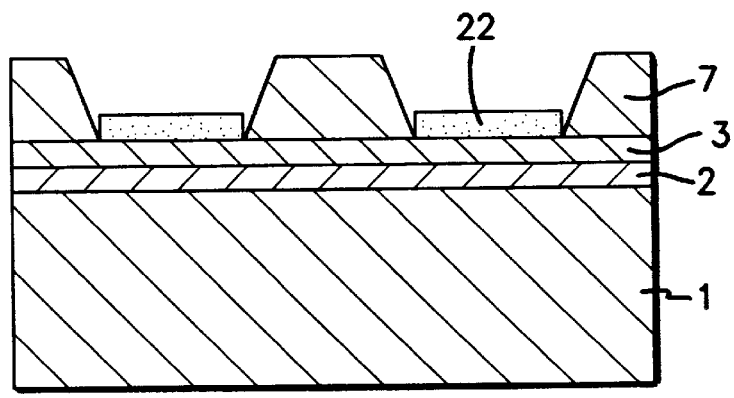
FIG. 3C is a cross sectional elevation view illustrative of an optical device in the prior art.
Figure 10:
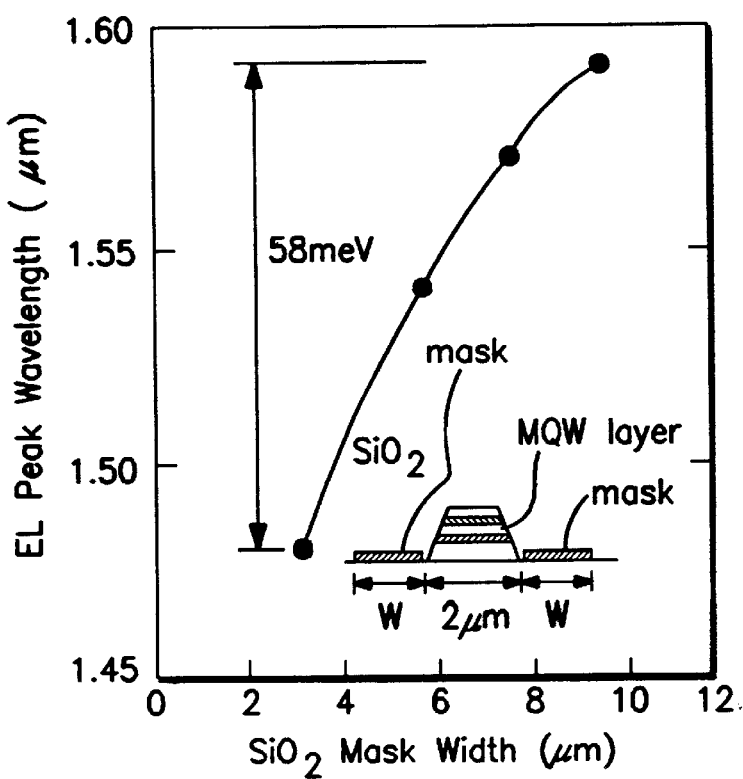
FIG. 10 is a diagram illustrative of characteristics of electroluminescence peak wavelength versus dielectric mask width.
Figure 4:
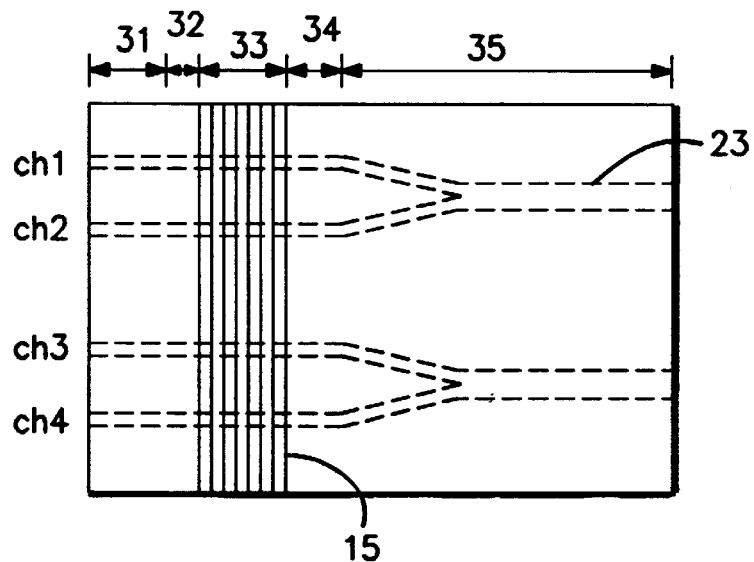
FIG. 4 is a plane view illustrative of a 4-channel optical integration device in the prior art.
Figure 5:
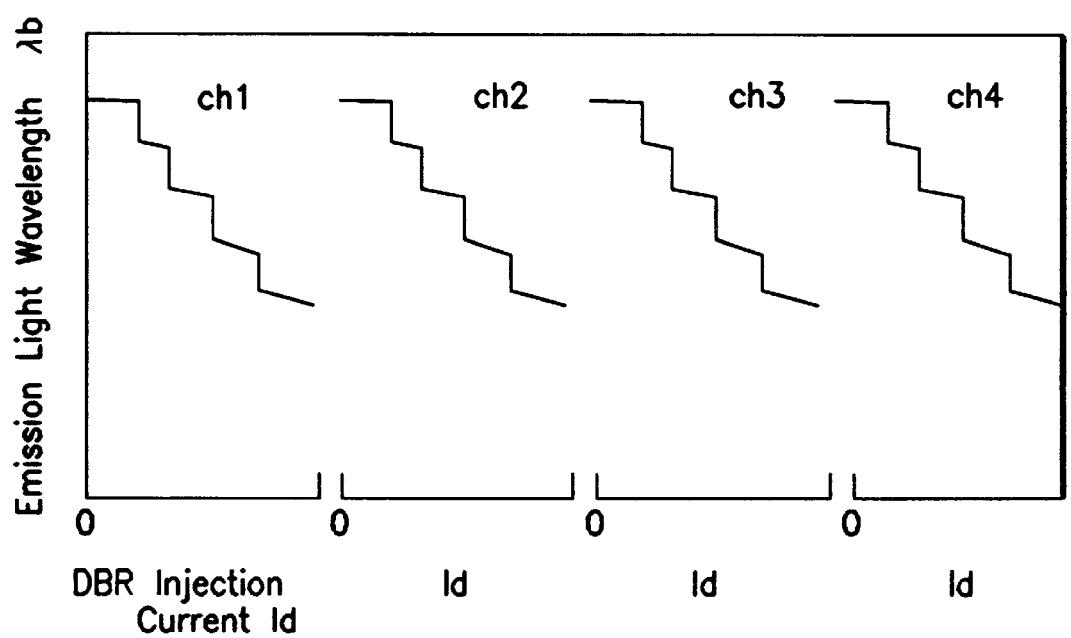
FIG. 5 is a diagram illustrative of characteristics of emission light wavelength versus injection current in multi-channel laser arrays in the prior art.
Figure 6:
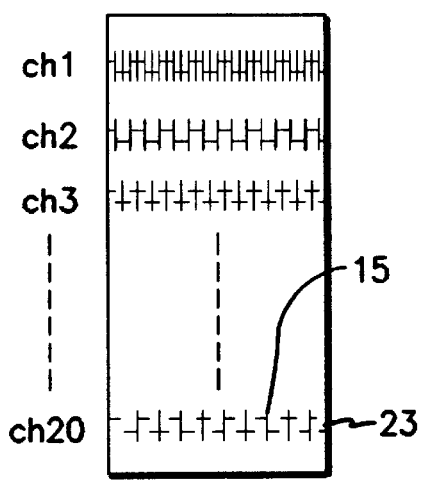
FIG. 6 is a plane view illustrative of grating pitches of 20-channels of laser arrays in the prior art.
Figure 7:
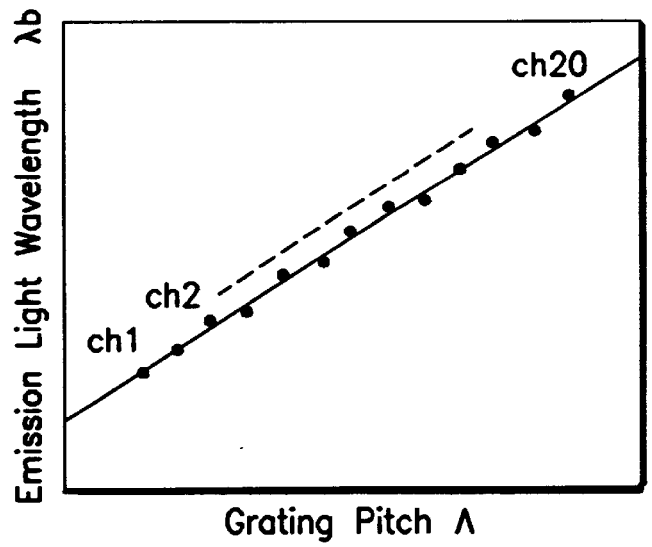
FIG. 7 is a diagram illustrative of characteristics of emission light wavelength versus grating pitch of a 20-channel laser arrays in the prior art.
Figure 8:
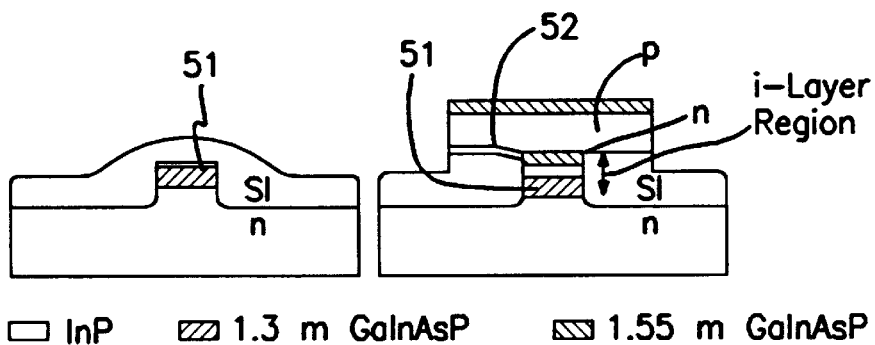
FIG. 8 is a cross sectional elevation view illustrative of optical amplifier gate switching arrays in the prior art.
Figure 9:
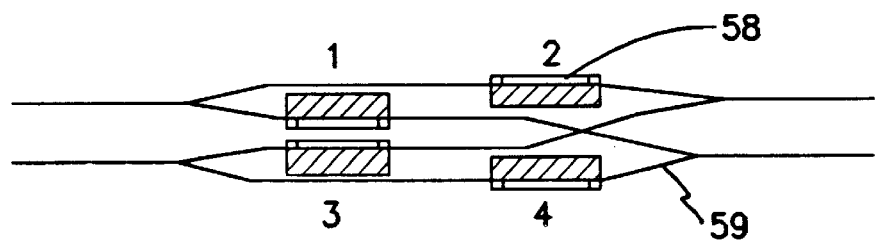
FIG. 9 is a plane view illustrative of optical amplifier gate switching arrays with 2×2 matrix structure in the prior art.

The description will be directed to a fabrication method of a tunable distributed Bragg reflector semiconductor laser device of a first embodiment according to the present invention. The description will be made with reference to FIGS. 11, 12, 13 and 14.

An n-InP substrate 1 comprises an active region 31, a phase control region 32 and a tuning region or a distributed Bragg reflector region 33. The active region 31, the phase control region 32 and the distributed Bragg reflector region 33 are 600 micrometers, 150 micrometers and 300 micrometers respectively in lengths along a longitudinal direction or a cavity direction. The n-InP substrate 1 has a (100) orientation surface. A first order corrugation grating with a constant pitch, not illustrated, is formed in the distributed Bragg reflector region 33 on the (100) surface of the n-InP substrate 1. An n-InGaAsP guiding layer 2 is formed on an entire surface of the n-InP substrate 1. The n-InGaAsP guiding layer 2 has a thickness of 100 nanometers and a carrier concentration of $1 \times 10^{18}$ cm$^{-3}$. An n-InP spacer layer 3 is grown on an entire surface of the n-InGaAsP guiding layer 2. The InP spacer layer has a thickness of 70 nanometers and a carrier concentration of $1 \times 10^{18}$ cm$^{-3}$.

Figure 11:
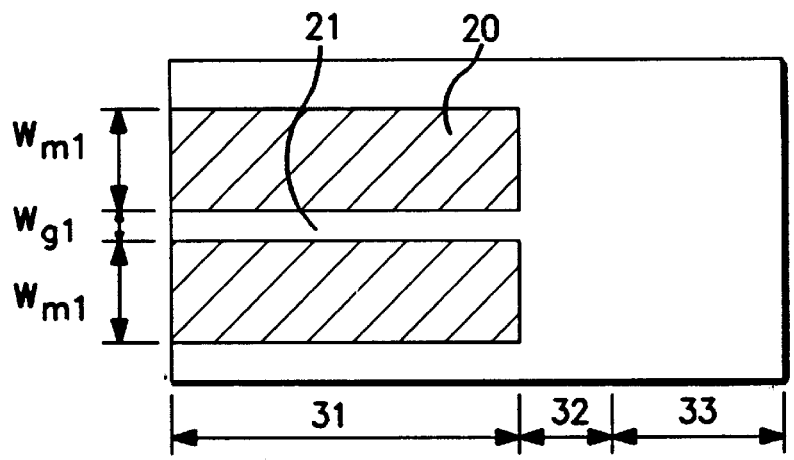
FIGS. 11 and 12 are plane views illustrative of dielectric stripe mask patterns used for fabrication processes of laser devices in a first embodiment according to the present invention.

As illustrated in FIG. 11, a pair of dielectric stripe masks 20 is selectively formed in the active region only on the n-InP spacer layer 3. The dielectric stripe masks 20 are made of SiO$_2$. Each of the dielectric stripe masks 20 has a longitudinal length of 600 micrometers and a width $W_{m1}$ of 30 micrometers. The pair of the dielectric stripe masks 20 is symmetrically arranged along the cavity direction of the laser device or a (011) direction. The paired dielectric stripe masks 20 sandwich or define a first selective growth area 21 along a center axis of the n-InP substrate 1. It is important that the dielectric stripe masks 20 are formed only in the active region 31, namely no dielectric stripe mask is formed in the phase control region 32 and the distributed Bragg reflector region 33. A gap $W_{g1}$ of the paired dielectric stripe masks 20 is 1.5 micrometers. The paired dielectric stripe masks are used as a mask pattern for a selective metal organic vapor phase epitaxy to form multiple epitaxial layers in the selective growth area 21.

An n-InP clad layer 4 is grown on the n-InP spacer layer 3 by the metal organic vapor phase epitaxy with use of the paired dielectric stripe mask pattern 20. As a result, the n-InP clad layer 4 is not selectively grown in the phase control region 32 and the distributed Bragg reflector region 33 and selectively grown an uncovered area including the selective growth area 21 in the active region 31 except for the dielectric stripe mask patterns 20. Namely, the n-InP clad layer 4 is grown on the phase control region 32 and the distributed Bragg reflector region 33 but selectively grown on the selective growth area 21 in the active region 31. The n-InP clad layer 4 in the active region 31 has a thickness of 50 nanometers and a carrier concentration of $1 \times 10^{18}$ cm$^{-3}$. An undoped multiple quantum well layer 5 is selectively grown on the n-InP clad layer 4 by the metal organic vapor phase epitaxy with use of the paired dielectric stripe mask pattern 20. As a result, the multiple quantum well layer 5 is grown on the phase control region 32 and the distributed Bragg reflector region 33 but selectively grown on the selective growth area 21 in the active region 31. A growth pressure for the multiple quantum well layer 5 is 150 Torr. The multiple quantum well layer 5 comprises seven InGaAs well layers and InGaAsP barrier layers. The InGaAs well layer and the InGaAsP barrier layer grown on the selective growth area 21 have thicknesses of 7 nanometers and 15 nanometers respectively. Subsequently, a p-InP clad layer 6 is selectively grown on the multiple quantum well layer 5 by the metal organic vapor phase epitaxy with use of the paired dielectric stripe mask pattern 20. As a result, the p-InP clad layer 6 is grown on the phase control region 32 and the distributed Bragg reflector region 33 but selectively grown on the selective growth area 21 in the active region 31. The p-InP clad layer 6 has a thickness of 200 nanometers in the selective growth area 21 and a carrier concentration of $7 \times 10^{17}$ cm$^{-3}$. The above epitaxially grown multiple layers 4, 5 and 6 on the selective growth area 21 have a rigged structure as illustrated in FIG. 13.

Individual thicknesses of the n-InP clad layer 4, the InGaAs/InGaAsP multiple quantum well layer 5 and the p-InP clad layer 6 are different between in the selective growth region 21 defined by the dielectric stripe mask pattern 20 and in the phase control region 32 and the distributed Bragg reflector region 33. The thicknesses of the above epitaxial layers 4, 5 and 6 in the selective growth area 21 sandwiched by the dielectric stripe mask pattern 20 are approximately three times the thicknesses of the above epitaxial layers 4, 5 and 6 in the phase control region 32 and the distributed Bragg reflector region 33.

Figure 12:
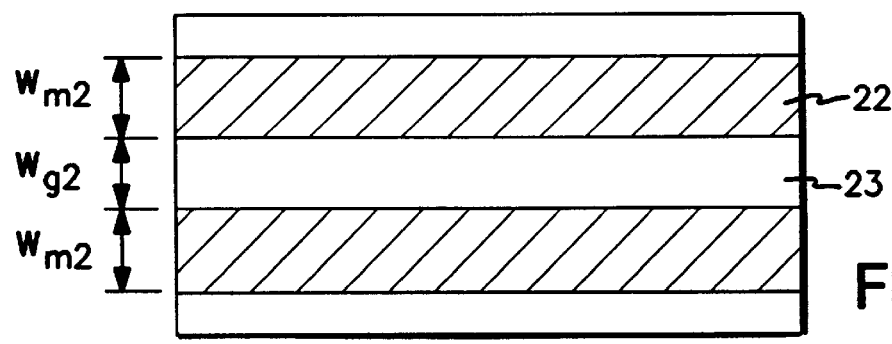

The dielectric strip mask pattern 20 is removed after the selective growth of the multiple epitaxial layers 4. 5 and 6. As illustrated in FIG. 12, a pair of dielectric stripe masks 22 is selectively formed to be extend through the active, phase control and distributed Bragg reflector regions 31, 32 and 33 on the device. The dielectric stripe masks 22 may be made of SiO$_2$. Each of the dielectric stripe masks 22 has a longitudinal length of 1050 micrometers and a width $W_{m2}$ of 10 micrometers. The pair of the dielectric stripe masks 22 is symmetrically arranged along the cavity direction of the laser device or the (011) direction. The paired dielectric stripe masks 22 sandwich or define a second selective growth area 23 along a center axis of the n-InP substrate 1. It is important that the dielectric stripe masks 22 are selectively formed not only in the active region 31 but also in the phase control region 32 and the distributed Bragg reflector region 33. A gap $W_{g2}$ of the paired dielectric stripe masks 22 is 6 micrometers.

Figure 13:
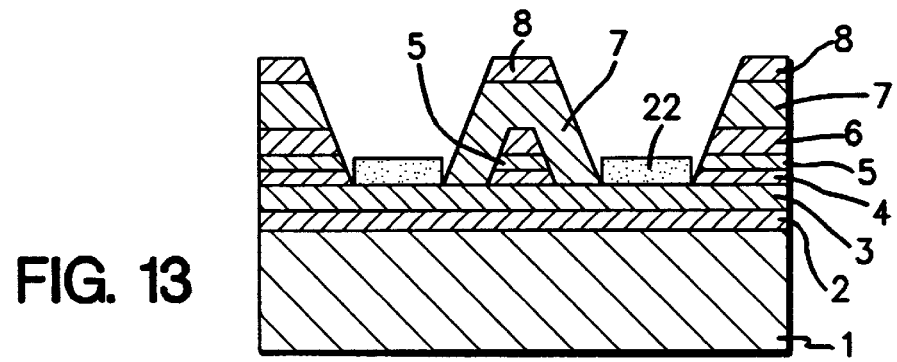
FIGS. 13 and 14 are fragmentary cross sectional elevation views illustrative of laser devices in a first embodiment according to the present invention.
Figure 14:
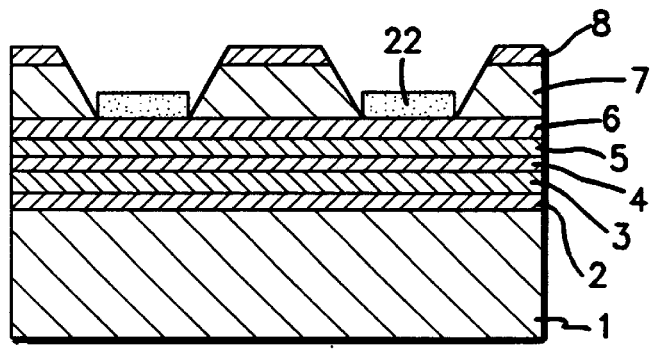

As illustrated in FIGS. 13 and 14, a p-InP clad layer 7 is grown on exposed areas of the device including the second selective growth area 23 by the metal organic vapor phase epitaxy with use of the paired dielectric stripe mask pattern 22. In the active region 31, the p-InP clad layer 7 is grown to cover the rigged epitaxial grown layers 4, 5 and 6 thereby the p-InP clad layer 7 has a mesa structure as illustrated in FIG. 13. On the other hand, in the phase control region 32 and the distributed Bragg reflector region 33, the p-InP clad layer 7 is grown on the p-InP clad layer 6 to have a mesa structure as illustrated in FIG. 14. The p-InP clad layer 7 grown on the second selective growth area 23 have a thickness of 1.5 micrometers and a carrier concentration of $1 \times 10^{17}$ cm$^{-3}$. A p-InGaAs cap layer 8 is selectively grown on a top of the mesa structure of the p-InP clad layer 7 to be extended through the active, phase control and distributed Bragg reflector regions 31, 32 and 33. The p-InP cap layer 8 has a thickness of 300 nanometer and a carrier concentration of $1 \times 10^{19}$ cm$^{-3}$. The p-InP clad layer 7 in the active region 31 is smoothly coupled to that of the p-InP clad layer 7 in the phase control region 32.

The InGaAs/InGaAsP multiple quantum well layer 5 has a variation in both thickness and material composition between the active region 31 and the other regions or the phase control region 32 and the distributed Bragg reflector region 33. The InGaAs/InGaAsP multiple quantum well layer 5 has different photoluminescence peak wavelengths or different propagation constants between in the mask pattern free regions and in the first selective growth region 21 defined by the dielectric stripe mask pattern 20. The multiple quantum well layer 5 thus possesses different photoluminescence peak wavelengths of 1.55 micrometers in the active region 31 and 1.40 micrometers in the distributed Bragg reflector region 33. The difference in the photoluminescence peak wavelength between the active region 31 and the distributed Bragg reflector region 33 is 150 nanometers which is considerably large, whose value has never been available by the conventional fabrication techniques.

After the selective growths of the epitaxial layers, the second dielectric stripe mask pattern 22 is removed. A dielectric film made of $SiO_2$ is subsequently formed on an entire surface of the device. Stripe windows of the dielectric $SiO_2$ film are selectively formed on the p-InGaAs cap layer 8 on the top of the mesa structure. A p-side electrode is selectively formed in the stripe windows to contact with the p-InGaAs cap layer 8. An n-side electrode is formed on a bottom surface of the n-InP substrate 1. The n-InP substrate 1 is cleaved so that the lengths of the active, phase control and distributed Bragg reflector regions 31, 32 and 33 are 600 micrometers, 150 micrometers and 300 micrometers respectively.

Figure 20:
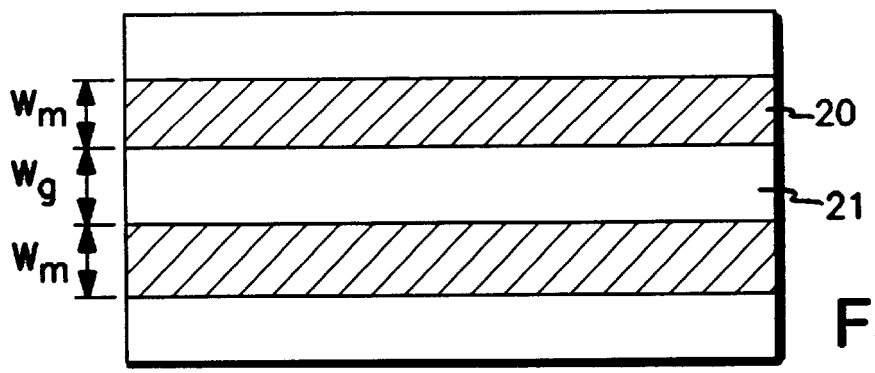
FIG. 20 is a plane view illustrative of dielectric stripe mask patterns used for a fabrication process for an optical integration device.
Figure 21:
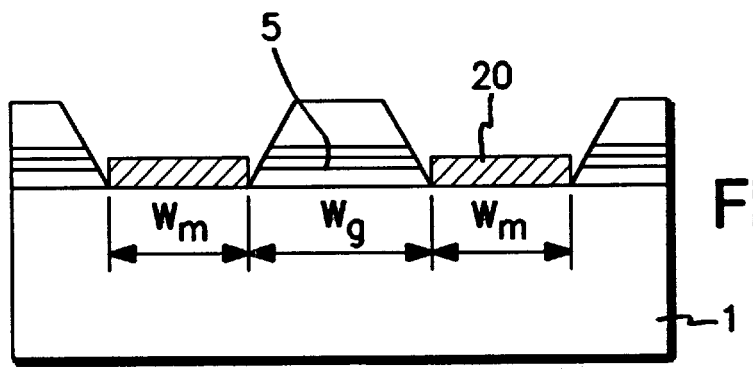
FIG. 21 is a fragmentary cross sectional elevation view illustrative of an optical integration device.
Figure 22:
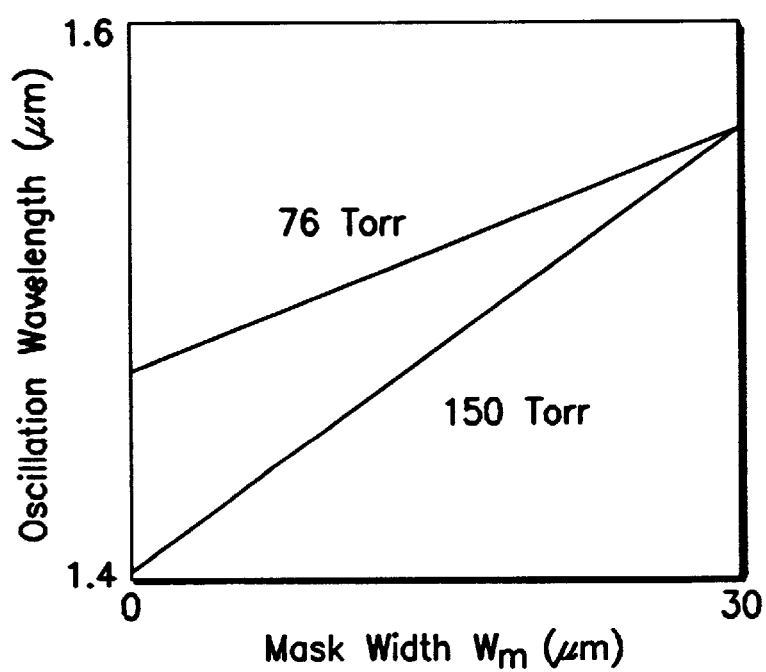
FIG. 22 is a diagram illustrative of characteristics of emission light wavelength versus mask width under variable growth pressure.

A description will be directed to a relationship between the dielectric stripe mask width and the photoluminescence peak wavelength of the multiple quantum well layer grown by the selective metal organic vapor phase epitaxy with use of the dielectric stripe mask pattern. As illustrated in FIGS. 20 and 21, a dielectric stripe mask pattern 20 is selectively formed on a semiconductor substrate 1 to sandwich or define a selective growth region 21. A width of the dielectric stripe mask 20 is $W_m$ and a gap width between them is $W_g$. Multiple epitaxial layers including a multiple quantum well structure 5 are selectively grown on the substrate 1 by the metal organic vapor phase epitaxy with use of the dielectric stripe mask pattern 20. The relationship between the mask width $W_m$ and the photoluminescence peak wavelength possessed by the multiple quantum well structure is illustrated in FIG. 22. From FIG. 22, it would be appreciated that The photoluminescence peak wavelength of the multiple quantum well structure 5 is approximately proportional to the dielectric stripe mask width 20. Namely, the increase of the dielectric stripe mask width $W_m$ provides the increase of the photoluminescence peak wavelength. A high growth pressure for the multiple quantum well structure provides a large differential constant of the proportional function of the photoluminescence peak wavelength versus the dielectric stripe mask width. A 150 Torr growth pressure condition for the selective metal organic vapor phase epitaxy for the multiple quantum well structure 5 provides a large variation of the photoluminescence peak wavelength caused by the variation of the dielectric stripe mask width rather than that of a 76 Torr growth pressure. Simultaneously, the increase of the dielectric stripe mask width $W_m$ provides the decrease of the band gap energy of the multiple quantum well structure 5. Namely, the bang gap energy of the multiple quantum well structure 5 is inversely proportional to the dielectric mask width because the band gap energy is proportional to the reciprocal of the photoluminescence peak wavelength.

Therefore, the multiple quantum well layer 5 in the active region 31 has the small band gap energy, the long photoluminescence peak wavelength and the large thickness as compared to the phase control region 32 and the distributed Bragg reflector region 33.

The mesa or ridge structure of the p-InP clad layer 7 grown by the selective metal organic vapor phase epitaxy has extremely smooth side walls which permits a considerable reduction of a waveguide loss due to optical scattering.

Namely, the ridge structure of the p-InP clad layer 7 is able to show exhibit a extremely low wave guide loss. The epitaxial layer including the multiple quantum well structure 5 is simultaneously grown in the different band gap energy regions by the single selective metal organic vapor phase epitaxy with use of the selectively formed stripe mask pattern. The fabrication process of the distributed Bragg reflector laser device monolithically integrated on the semiconductor is completely free from any etching process such as mesa etching process. Although the multiple quantum well layer is very thin in the phase control region 32 and the distributed Bragg reflector region 33, the n-InGaAsP guiding layer 2 formed on the entire surface of the n-InP substrate 1 acts to keep a stability of the propagation mode of the wave guide layer. A measured threshold current of the distributed Bragg reflector laser device is 9 mA in the average. The distributed Bragg reflector laser device exhibits a high optical output more than 30 mW. A wide tunable range of more than 5 nanometers in the output light wavelength is obtained with a mode skip and a stable optical output of 10 mW by injecting a current injection of 20 mA into the distributed Bragg reflector region 33. A further current injection of 10 mA into the phase control region 32 together with the above distributed Bragg reflector region current injection permits a continuous photoluminescence peak wavelength shift free of any mode skip, and thus permits a continuous and wide tunable wavelength range completely covering the skipped mode wavelength.

The above novel fabrication processes completely free of any mesa etching process of the first embodiment according to the present invention is able to provide the large and continuous tunable wavelength range and a high yield as well as a uniformity of excellent properties of the fabricated laser device.

A second embodiment of the present invention is directed to a novel fabrication process of optical integrated circuits having a monolithic integration with a distributed feedback laser, an optical amplifier and a passive optical wave guide. A structure of the device is similar to that of the first embodiment, although dielectric stripe mask pattern only is illustrated in FIG. 15.

An n-InP substrate comprises a distributed feed back laser region 34, an optical amplifier region 35 and a passive wave guide region 36. A first order corrugation grating with a constant pitch, not illustrated, is formed in the distributed feedback laser region 33 on a (100) surface of the n-InP substrate. An n-InGaAsP guiding layer is formed on an entire surface of the n-InP substrate. An n-InP spacer layer 3 is grown on an entire surface of the n-InGaAsP guiding layer 2.

Figure 15:
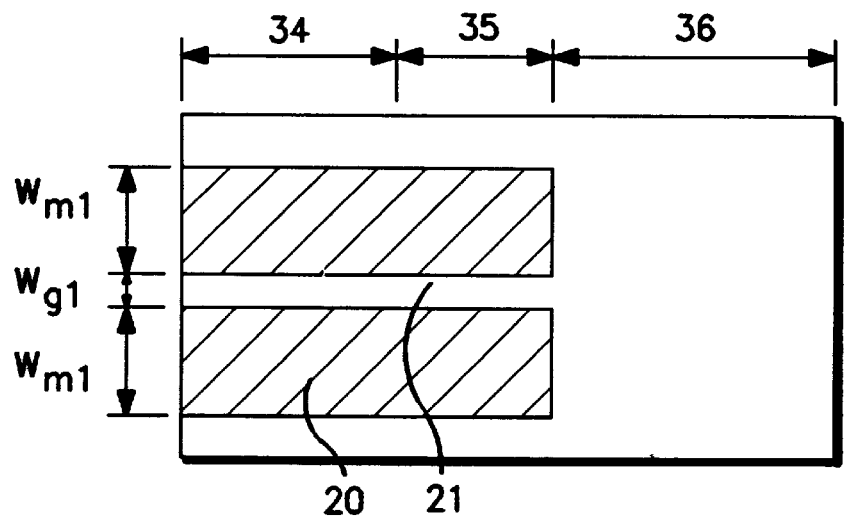
FIG. 15 is a plane view illustrative of dielectric stripe mask patterns used for a fabrication process of a laser device in a second embodiment according to the present invention.

As illustrated in FIG. 15, a pair of dielectric stripe masks 20 is selectively formed in the distributed feedback laser region 34 and the optical amplifier region 35 only. The dielectric stripe masks 20 are made of $SiO_2$. Each of the dielectric stripe masks 20 has a constant width $W_{ml}$ of 30 micrometers. The pair of the dielectric stripe masks 20 is symmetrically arranged along the cavity direction of the laser device or the (011) direction. The paired dielectric stripe masks 20 sandwich or define a first selective growth area 21 along a center axis of the n-InP substrate 1. It is important that the dielectric stripe masks 20 are formed only in the active regions such as the distributed feedback laser region 34 and the optical amplifier region 35, namely no dielectric stripe mask is formed in the passive wave guide region 36. A gap width $W_{gl}$ of the paired dielectric stripe masks 20 is 1.5 micrometers. The paired dielectric stripe masks 20 are used as a mask pattern for a subsequent selective metal organic vapor phase epitaxy to grow multiple epitaxial layers in the selective growth area 21.

An n-InP clad layer is grown on the n-InP spacer layer by the metal organic vapor phase epitaxy with use of the paired dielectric stripe mask pattern 20. As a result, the n-InP clad layer is not selectively grown in the passive wave guide region 36 and selectively grown in the distributed feedback laser region 34 and the optical amplifier region 35. The n-InP clad layer in the distributed feedback laser region 34 has a thickness of 50 nanometers and a carrier concentration of $1\times10^{18}$ cm$^{-3}$. An undoped multiple quantum well layer is selectively grown on the n-InP clad layer by the metal organic vapor phase epitaxy with use of the paired dielectric stripe mask pattern 20. As a result, the multiple quantum well layer is not selectively grown on the passive wave guide region 36 but selectively grown on the selective growth area 21 in the distributed feedback laser region 34 and the optical amplifier region 35. A growth pressure for the multiple quantum well layer 5 is 150 Torr. The multiple quantum well layer comprises seven InGaAs well layers and InGaAsP barrier layers. The InGaAs well layer and the InGaAsP barrier layer grown on the selective growth area 21 have thicknesses of 7 nanometers and 15 nanometers respectively. Subsequently, a p-InP clad layer is selectively grown on the multiple quantum well layer by the metal organic vapor phase epitaxy with use of the paired dielectric stripe mask pattern 20. As a result, the p-InP clad layer is not selectively grown on the passive wave guide region 36 but selectively grown on the selective growth area 21 in the distributed feedback laser region 34 and the optical amplifier region 35. The above epitaxially grown multiple layers 4, 5 and 6 on the selective growth area 21 have a rigged or mesa structure.

Individual thicknesses of the n-InP clad layer, the InGaAs/InGaAsP multiple quantum well layer and the p-InP clad layer are different between in the selective growth region 21 defined by the dielectric stripe mask pattern 20 and in the passive wave guide region 36. The thicknesses of the above epitaxial layers in the selective growth area 21 sandwiched by the dielectric stripe mask pattern 20 are approximately three times of the thicknesses of the above epitaxial layers in the passive wave guide region 36.

The dielectric strip mask pattern 20 is removed after the selective growth of the multiple epitaxial layers. A pair of dielectric stripe masks is selectively formed to extend through the entire regions or the distributed feedback laser region 34, the optical amplifier region 35 and the passive wave guide region 36. The dielectric stripe masks may be made of SiO$_2$. Each of the dielectric stripe masks has a width $W_{m2}$ of 10 micrometers. The pair of the dielectric stripe masks is symmetrically arranged along the cavity direction of the laser device or the (011) direction. The paired dielectric stripe masks sandwich or define a second selective growth area along a center axis of the n-InP substrate. It is important that the dielectric stripe masks are selectively formed not only in the entire regions 34, 35 and 36. A gap $w_{g2}$ of the paired dielectric stripe masks is 6 micrometers.

A p-InP clad layer is selectively grown on the second selective growth area by the metal organic vapor phase epitaxy with use of the paired dielectric stripe mask pattern. In the distributed feedback region 34 and the optical amplifier region 35, the p-InP clad layer is grown to cover the rigged epitaxial grown layers thereby the p-InP clad layer has a mesa structure. On the other hand, in the passive wave guide region 36, the p-InP clad layer is grown on the p-InP clad layer to have a mesa structure. A p-InGaAs cap layer is selectively grown on a top of the mesa structure of the p-InP clad layer to be extended through the entire regions 34, 35 and 36. The p-InP clad layer in the optical amplifier region 35 is smoothly coupled to that of the p-InP clad layer in the passive wave guide region.

The InGaAs/InGaAsP multiple quantum well layer has a variation in both thickness and material composition between the passive wave guide region 36 and the active regions such as the distributed feedback laser region 34 and the optical amplifier region 35. The InGaAs/InGaAsP multiple quantum well layer has different photoluminescence peak wavelengths or different propagation constants between in the mask pattern free passive region 36 and in the selective growth region 21 defined by the dielectric stripe mask pattern 20. The multiple quantum well layer thus possesses different photoluminescence peak wavelengths of 1.55 micrometers in the active regions 34 and 35 and 1.40 micrometers in the passive wave guide region 36. The difference in the photoluminescence peak wavelength between the active regions 34 and 35 and the passive wave guide region 36 is 150 nanometers which is considerably large, whose value has never been available by the conventional fabrication techniques.

After the selective growths of the epitaxial layers, the second dielectric stripe mask pattern is removed. A dielectric film made of SiO$_2$ is subsequently formed on an entire surface of the device. Stripe windows of the dielectric SiO$_2$ film are selectively formed on the p-InGaAs cap layer on the top of the mesa structure. A p-side electrode is selectively formed in the stripe windows to contact with the p-InGaAs cap layer in the active regions 34 and 35 only. An n-side electrode is formed on a bottom surface of the n-InP substrate.

The multiple quantum well layer in the active regions 34 and 35 has the small band gap energy, the long photoluminescence peak wavelength and the large thickness as compared to that in the passive wave guide region 36.

The mesa or ridge structure of the p-InP clad layer grown by the selective metal organic vapor phase epitaxy has extremely smooth side walls which permits a considerable reduction of a waveguide loss due to optical scattering. Namely, the ridge structure of the p-InP clad layer is able to exhibit a extremely low wave guide loss. The epitaxial layer including the multiple quantum well structure is simultaneously grown in the different band gap energy regions by the single selective metal organic vapor phase epitaxy with use of the selectively formed stripe mask pattern. The fabrication process of the optical integrated circuits is completely free from any etching process such as mesa etching process. An evaluated internal gain of the optical amplifier is 20 dB. A wave guide loss is 15 cm$^{-1}$, A coupling efficiency between the optical amplifier region 35 and the passive wave guide 36 is more than 95%. The above novel fabrication processes completely free of any mesa etching process of the first embodiment according to the present invention is able to provide the large and continuous tunable wavelength range and a high yield as well as a uniformity of excellent properties of the fabricated laser device.

A third embodiment of the present invention is directed to a novel fabrication process of a semiconductor optical amplifier with anti-reflection coated facets showing a low window facet reflectivity. The optical amplifier with the anti-reflection coated facets comprises an active region 31 and front and rear window regions 37. Longitudinal lengths along the wave guide direction of the active region 31 and the window region 37 are 300 micrometers and 30 micrometers respectively. As similar to the first and second embodiments, an n-InGaAs guide layer and an n-InP spacer layer are formed in turn on a (100) surface of an n-InP semiconductor substrate.

Figure 16:
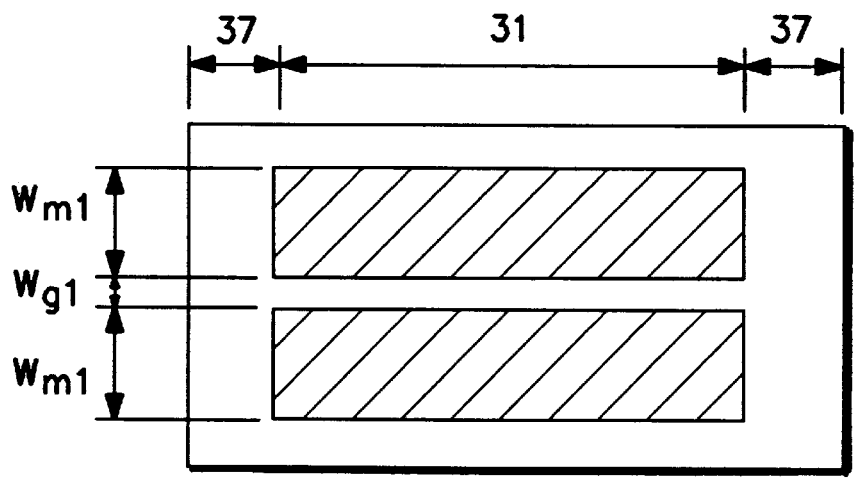
FIGS. 16 and 17 are plane views illustrative of dielectric stripe mask patterns used for fabrication processes for an optical amplification device in a third embodiment according to the present invention.

As illustrated in FIG. 16, a pair of dielectric stripe masks 20 is selectively formed in the active region 31 only. The dielectric stripe masks 20 may be made of SiO$_2$. Each of the dielectric stripe masks 20 has a longitudinal length of 300 micrometers and a width W$_{ml}$ of 30 micrometers. The pair of the dielectric stripe masks 20 is symmetrically arranged along the wave guide direction of the optical amplifier device. The paired dielectric stripe masks 20 sandwich or define a first selective growth area 21 along a center axis of the n-InP substrate. It is important that the dielectric stripe masks 20 are formed only in the active region 31, namely no dielectric stripe mask is formed in the window regions 37. A gap W$_{g1}$ of the paired dielectric stripe masks 20 is 1.5 micrometers. The paired dielectric stripe masks are used as a mask pattern for a selective metal organic vapor phase epitaxy to form multiple epitaxial layers in the selective growth area 21.

An n-InP clad layer, a multiple quantum well layer and a first p-InP clad layer are epitaxially and sequentially grown by the metal organic vapor phase epitaxy with use of the paired dielectric stripe mask pattern 20. As a result, the epitaxial multiple layers including the multiple quantum well structure are not selectively grown in the window regions 37 and selectively grown in the active region including the first selective growth area 21. Ache multiple quantum well layer may comprise seven InGaAs well layers and InGaAsP barrier layers. The InGaAs well layer and the InGaAsP barrier layer grown on the selective growth area 21 may have thicknesses of 7 nanometers and 15 nanometers respectively. The above epitaxially grown multiple layers 4, 5 and 6 on the selective growth area 21 have a ridged structure as illustrated in FIG. 13.

Individual thicknesses of the n-InP clad layer, the multiple quantum well layer and the p-InP clad layer are different between in the selective growth region 21 defined by the dielectric stripe mask pattern 20 and in the window regions 37. The thicknesses of the above epitaxial layers in the selective growth area 21 sandwiched by the dielectric stripe mask pattern 20 are approximately three times of the thicknesses of the above epitaxial layers in the window regions 37.

Figure 17:
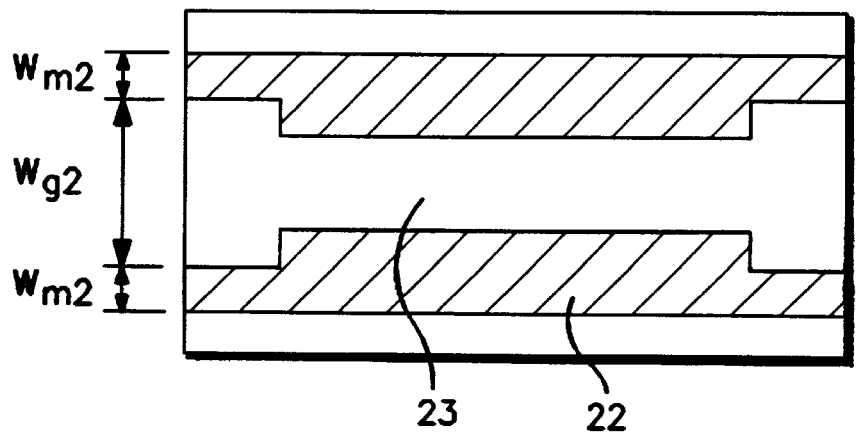

The dielectric strip mask pattern 20 is removed after the selective growth of the multiple epitaxial layers. As illustrated in FIG. 17, a pair of second dielectric stripe masks 22 is selectively formed to be extend through the active, window regions 31 and 37. The second dielectric stripe masks 22 may be made of SiO$_2$. Each of the dielectric stripe masks 22 has a longitudinal length of 360 micrometers and a difference in width. In the window regions 37, the dielectric stripe mask 22 has a width W$_{m2}$ of 10 micrometers and a gap width W$_{g2}$ of 6 micrometers. In the active region 31, the dielectric stripe mask 22 has a wider width and a narrower gap width rather than that in the window regions 37 as illustrated in FIG. 17. The pair of the dielectric stripe masks 22 is symmetrically arranged along the cavity direction of the laser device or the (011) direction. The paired dielectric stripe masks 22 sandwich or define a second selective growth area 23 along a center axis of the n-InP substrate. It is important that the dielectric stripe masks 22 are selectively formed not only in the active region 31 but also in the window regions 37 and the mask width is different between in the active region 31 and the window regions 37.

A p-InP clad layer is grown on the second selective growth area 23 by the metal organic vapor phase epitaxy with use of the paired dielectric stripe mask pattern 22. In the active region 31, the p-InP clad layer has a large thickness rather than that in the window regions 37 to reduce the wave guide optical loss in the window regions 37. A p-InGaAs cap layer is selectively grown on a top of the mesa structure of the p-InP clad layer in the active region 31. The p-InP clad layer in the active region 31 is smoothly coupled to that of the p-InP clad layer in the window regions 37.

The fabricated optical amplifier with the window facet regions shows excellent properties in a high internal gain of 25 dB and a facet reflectivity of 10$^{-5}$. The above novel fabrication processes is completely free of any mesa etching process of the first embodiment according to the present invention to obtain a high yield and a uniformity of excellent properties of the optical amplifier monolithically integrated on the semiconductor substrate.

A fourth embodiment of the present invention is directed to a novel fabrication process of semiconductor optical integrated circuit for 2-channel communication system. The semiconductor optical integrated circuit comprises a monolithic integration with tunable distributed Bragg reflector semiconductor laser devices, modulators, a passive wave guide optical coupler acting as optical combiner and a single optical amplifier. An n-InP substrate 1 comprises an active region 31, a tuning region or a distributed Bragg reflector region 33, a modulator region 38, a passive wave guide optical coupler region 36 and an optical amplifier region 35. The lengths in the longitudinal direction of the active region 31, the distributed Bragg reflector region 33, the modulator region 38, the passive wave guide optical coupler region 36 and the optical amplifier region 35 are 600 micrometers, 150 micrometers, 200 micrometers and 1500 micrometers and 300 micrometers respectively. Fragmentary cross sectional structures of a novel semiconductor optical integrated circuit in the active region 31, the modulator region 38 and the optical amplifier region 36 are similar to the structure illustrated in FIG. 13. Fragmentary cross sectional structures of a novel semiconductor optical integrated circuit in the distributed feedback laser region 33 and the passive wave guide optical coupler region 35 are similar to the structure illustrated in FIG. 14. The fourth embodiment of the present invention will be described with reference to FIGS. 13, 14, 18 and 19.

The n-InP substrate 1 has a (100) orientation surface. A first order corrugation grating with a constant pitch not illustrated is formed in the distributed Bragg reflector region 33 on the (100) surface of the n-InP substrate 1. An n-InGaAsP guiding layer 2 is formed on an entire surface of the n-InP substrate 1. The n-InGaAsP guiding layer 2 has a thickness of 100 nanometers and a carrier concentration of 1×10$^{18}$ cm$^{-3}$. An n-InP spacer layer 3 is grown on an entire surface of the n-InGaAsP guiding layer 2. The InP spacer layer has a thickness of 70 nanometers and a carrier concentration of 1×10$^{18}$ cm$^3$.

Figure 18:
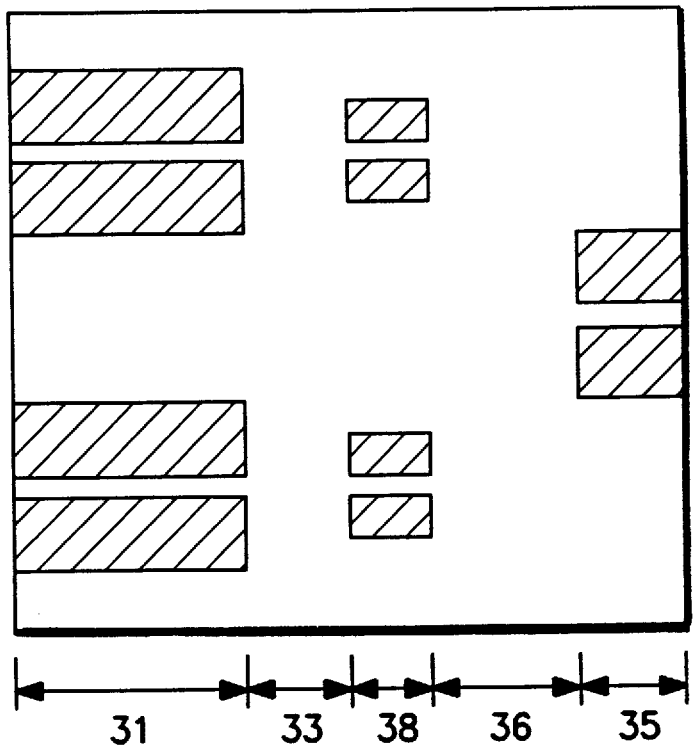
FIGS. 18 and 19 are plane views illustrative of dielectric stripe mask patterns used for fabrication processes for an optical integration device in a fourth embodiment according to the present invention.

As illustrated in FIG. 18, a plurality of pairs of dielectric stripe masks 20 are selectively formed in the active region 31, the modulator region 38 and the optical amplifier region 35 only. The dielectric stripe masks 20 are made of SiO$_2$. The dielectric stripe masks 20 in the active region 31 and in the optical amplifier region 35 have longitudinal lengths of 600 micrometers and 300 micrometers and the same width of 30 micrometers. On the other hand, the dielectric stripe masks 20 in the modulator region 38 have a longitudinal length of 200 micrometers and a width of 15 micrometers. Each the pair of the dielectric stripe masks 20 is symmetrically arranged along the cavity direction of the laser device or the (011) direction. In the active region 31 and the modulator region 38, two pairs of the dielectric stripe masks 20 are symmetrically arranged to be separated at a distance from the center axis of the substrate along the cavity direction or the (011) direction. In the optical amplifier region 35, the single pair of the dielectric stripe masks exists on the center axis of the substrate. Each pair of the dielectric stripe masks 20 sandwich or define first selective growth areas 21 whose longitudinal direction is parallel to the cavity direction or the (011) direction. It is important that the dielectric stripe masks 20 are selectively formed in the active region 31, the modulator region 38 and the optical amplifier region 35 only. Namely, no dielectric stripe mask is formed in the distributed Bragg reflector region 33 and the passive wave guide optical coupler region 36. The paired dielectric stripe masks 20 in the active region 31, the modulator region 38 and the optical amplifier region 35 has the same gap width of 1.5 micrometers. The paired dielectric stripe masks are used as a mask pattern for a subsequent selective metal organic vapor phase epitaxy to form multiple epitaxial layers in the selective growth area 21.

An n-InP clad layer 4 is grown on the n-InP spacer layer 3 by the metal organic vapor phase epitaxy with use of the paired dielectric stripe mask pattern 20. As a result, the n-InP clad layer 4 is inselectively grown in the distributed Bragg reflector region 33 and the passive wave guide optical coupler region 36 and further selectively grown in the active region 31, the modulator region 38 and the optical amplifier region 36 including the first selective growth areas 21. The n-InP clad layer 4 grown on the first selective growth areas 21 has a thickness of 50 nanometers and a carrier concentration of $1 \times 10^{18}$ cm$^{-3}$. An undoped multiple quantum well layer 5 is selectively grown on the n-InP clad layer 4 by the metal organic vapor phase epitaxy with use of the paired dielectric stripe mask pattern 20. As a result, the multiple quantum well layer 5 is inselectively grown on the distributed Bragg reflector region 33 and the passive wave guide optical coupler region 36 but selectively grown in the active region 31, the modulator region 38 and the optical amplifier region 36 including the first selective growth areas 21. A growth pressure for the multiple quantum well layer 5 may be high, for example, 150 Torr. The multiple quantum well layer 5 comprises seven InGaAs well layers and InGaAsP barrier layers. The InGaAs well layer and the InGaAsP barrier layer grown on the selective growth areas 21 have thicknesses of 7 nanometers and 15 nanometers respectively. Subsequently, a p-InP clad layer 6 is selectively grown on the multiple quantum well layer 5 by the metal organic vapor phase epitaxy with use of the paired dielectric stripe mask pattern 20. As a result, the p-InP clad layer 6 is inselectively grown on the distributed Bragg reflector region 33 and the passive wave guide optical coupler region 36 but selectively grown on the active region 31, the modulator region 38 and the optical amplifier region 35 including the first selective growth areas 21. The p-InP clad layer 6 grown on the selective growth areas 21 has a thickness of 200 nanometers and a carrier concentration of $7 \times 10^{17}$ cm$^{-3}$. The above epitaxially grown multiple layers 4, 5 and 6 on the selective growth area 21 have a ridged or mesa structure.

Individual thicknesses of the n-InP clad layer 4, the InGaAs/InGaAsP multiple quantum well layer 5 and the p-InP clad layer 6 are different between in the selective growth areas 21 defined by the dielectric stripe mask pattern 20 and in the mask free regions such as the the distributed Bragg reflector region 33 and the passive wave guide optical coupler region 36. The thicknesses of the above epitaxial layers 4, 5 and 6 grown on the selective growth area 21 in the active region 31 and the optical amplifier region 35 are the most thick and approximately three times of the thicknesses of the above epitaxial layers 4, 5 and 6 in the mask pattern free regions or the distributed Bragg reflector region 33 and the passive wave guide optical coupler region 36. The thickness of the epitaxial layers 4, 5 and 6 grown on the selective growth area 21 in the modulator region 38 are thinner than that in the active region 31 and the optical amplifier region 35 and thicker than that in the mask pattern free regions or the distributed Bragg reflector region 33 and the passive wave guide optical coupler region 36. The above descriptions could readily be appreciated from the above described relationship between the epitaxial layer thickness and the mask stripe thickness.

Figure 19:
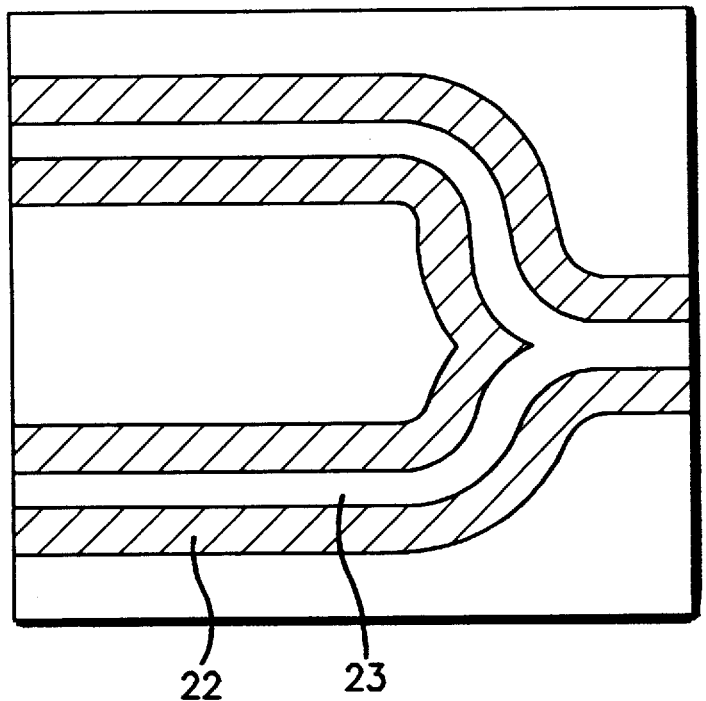

The dielectric strip mask pattern 20 is removed after the selective growth of the multiple epitaxial layers 4, 5 and 6. As illustrated in FIG. 19, a pair of dielectric stripe masks 22 is selectively formed to be extend through the entire regions or the active, distributed Bragg reflector, modulator, passive wave guide optical coupler and optical amplifier regions 31, 33, 38, 36 and 35. The dielectric stripe masks 22 may be made of $SiO_2$. The paired dielectric stripe masks 20 are separated from each other to have a constant gap width of 6 micrometers and to define a second selective growth area 23. A longitudinal center axis of the second selective growth area 23 defined by the second dielectric mask stripe pattern 23 corresponds to the longitudinal center axis of the first selective growth areas 21 as illustrated in FIGS. 18 and 19. Each of the second dielectric stripe masks 22 comprises an S-bend portion in the passive wave guide optical coupler region 36 and straight portions in the active region 31, the distributed Bragg reflector region 33, the modulator region 38 and the optical amplifier region 35. As to the dielectric stripe masks 22, the two channels of the straight portions in the active and distributed Bragg reflector and modulator regions 31, 33 and 38 are combined by the S-bend portion in the passive wave guide optical coupler region 36 into the single channel of the straight portion in the optical amplifier region 35. The paired dielectric stripe masks 22 are symmetrically arranged around the center axis along the cavity direction.

A p-InP clad layer 7 is selectively grown on the second selective growth area 23 by the metal organic vapor phase epitaxy with use of the paired dielectric stripe mask pattern 22. In the active, modulator and optical amplifier regions 31, 38 and 35, the p-InP clad layer 7 is grown to cover the rigged epitaxial grown layers 4, 5 and 6 thereby the p-InP clad layer 7 has a mesa structure as illustrated in FIG. 13. On the other hand, in the distributed Bragg reflector and passive wave guide optical coupler regions 33 and 36, the p-InP clad layer 7 is grown on the p-InP clad layer 6 to have a mesa structure as illustrated in FIG. 14. The p-InP clad layer 7 grown on the second selective growth area 23 has a thickness of 1.5 micrometers and a carrier concentration of $7 \times 10^{17}$ cm$^{-3}$. The mesa structure p-InP clad layer 7 comprises two separate straight portions in the active region 31, the distributed Bragg reflector region 33 and the modulator region 38, an S-bend portion in the passive wave guide optical coupler region 36 and a single straight portion in the optical amplifier region 35. The two separate mesa structure straight portions of the p-InP clad layer 7 are combined through the S-bend portion in the passive wave guide optical coupler region 36 into the single straight portion in the optical amplifier region 35. The S-bend portion of the mesa structure of the p-InP clad layer 7 acts as an optical coupler to combine the two channels into the single channel. A p-InGaAs cap layer 8 is selectively grown on top portions of the mesa structure of the p-InP clad layer 7 in the active region 31, the modulator region 38 and the optical amplifier region 35. The p-InP cap layer 8 grown in the second selective growth area 23 has a thickness of 300 nanometer and a carrier concentration of $1\times10^{19}$ cm$^{-3}$. The p-InP clad layer 7 in the modulator region 38 is smoothly coupled through the S-band portion acting as the optical coupler to the single straight portion in the optical amplifier region 35.

The InGaAs/InGaAsP multiple quantum well layer 5 has a variation in both thickness and material composition among the active and optical amplifier regions 31 and 35, the modulator region 38 and the distributed Bragg reflector and passive wave guide optical coupler regions 33 and 36. The InGaAs/InGaAsP multiple quantum well layer 5 has different photoluminescence peak wavelengths or different propagation constants among the active and optical amplifier regions 31 and 35, the modulator region 38 and the distributed Bragg reflector and passive wave guide optical coupler regions 33 and 36. The multiple quantum well layer 5 thus possesses different photoluminescence peak wavelengths among the active and optical amplifier regions 31 and 35, the modulator region 38 and the distributed Bragg reflector and passive wave guide optical coupler regions 33 and 36.

After the selective growths of the epitaxial layers, the second dielectric stripe mask pattern 22 is removed. A dielectric film made of $SiO_2$ may subsequently be formed on an entire surface of the device. Stripe windows of the dielectric $SiO_2$ film may selectively be formed on the p-InGaAs cap layer 8 in the active region 31, the modulator region 38 and the optical amplifier region 35. A p-side electrode may be formed in the stripe windows of the dielectric $SiO_2$ film so that the p-side electrode is selectively formed on the p-InGaAs cap layer 8 in the active region 31, the modulator region 38 and the optical amplifier region 35. An n-side electrode is formed on a bottom surface of the n-InP substrate 1.

Therefore, the multiple quantum well layer 5 grown on the first selective growth area 21 in the active region 31 and the optical amplifier region 35 has the smallest band gap energy, the longest photoluminescence peak wavelength and the largest thickness. In contrast, the multiple quantum well layer 5 grown in the distributed Bragg reflector region 33 and the passive wave guide optical coupler region 36 has the largest band gap energy, the shortest photoluminescence peak wavelength and the smallest thickness.

The mesa or ridge structure of the p-InP clad layer 7 grown by the selective metal organic vapor phase epitaxy has extremely smooth side walls which permits a considerable reduction of a waveguide loss due to optical scattering. Namely, the ridge structure of the p-InP clad layer 7 is able to exhibit an extremely low wave guide loss. The epitaxial layer including the multiple quantum well structure 5 is simultaneously grown in the different band gap energy regions by the single selective metal organic vapor phase epitaxy with use of the selectively formed stripe mask pattern. The fabrication process of the semiconductor optical integrated circuit is completely free from any etching process such as mesa etching process. A measured optical output power for each channel is more than 20 mW. An extinction ratio with application of 2V to the p-side electrode in the modulator region 38 is 15 dB. A desired modulated wavelength is obtained in a 2.5 Gb/s modulation. In associated 10 elements, the threshold voltage is in the range from 8 mA to 15 mA and the output power is in the range from 18 mW to 28 mW. A desirable uniformity in the device performances is obtained. A simplicity in the fabrication processes free of any etching process and complication thereof provides a high yield as well as a uniformity of excellent device performances of the fabricated laser device.

Figure 23:
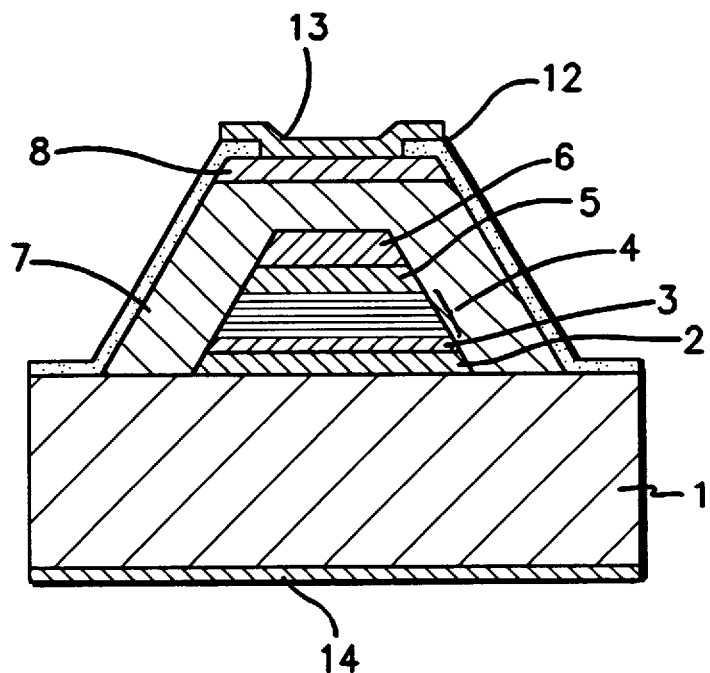
FIGS. 23 and 24 are fragmentary cross sectional elevation views illustrative of laser arrays of a fifth embodiment according to the present invention.
Figure 24:
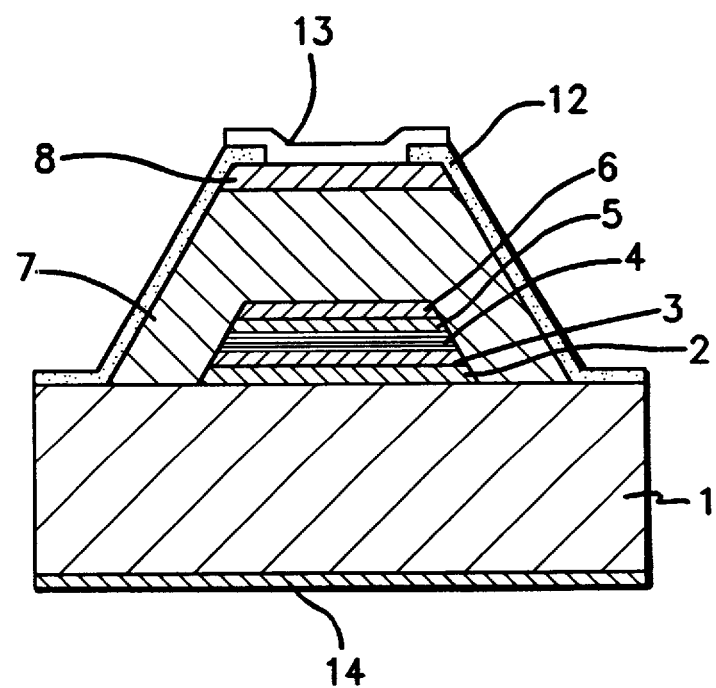

A fifth embodiment of the present invention is directed to a novel fabrication process of semiconductor optical integrated circuit with distributed Bragg reflector semiconductor laser array for multiple channel communication system in which distributed Bragg reflector semiconductor lasers show different photoluminescence wavelengths from each other. The semiconductor optical integrated circuit comprises a monolithic integration with ten tunable distributed Bragg reflector semiconductor laser devices of different output wavelengths arranged in parallel to each other. Each of the distributed Bragg reflector semiconductor lasers comprises an active region, a phase control region and a tuning region or a distributed Bragg reflector region. An n-InP substrate 1 therefore comprises an active region 31, a phase control region 32 and a tuning region or a distributed Bragg reflector region 33. The lengths in the longitudinal direction of the active region 31, the phase control region 32 and the distributed Bragg reflector region 33 may be 600 micrometers, 150 micrometers and 300 micrometers respectively. FIG. 23 illustrates the fragmentary cross sectional structure of the distributed Bragg reflector laser in the active region 31. FIG. 24 illustrates the fragmentary cross sectional structure of the distributed Bragg reflector laser in the phase control region 32. The fifth embodiment of the present invention will be described with reference to FIGS. 23, 24 and 25. The distributed Bragg reflector semiconductor laser array has ten channels of different output light wavelengths.

The n-InP substrate 1 has a (100) orientation surface. A first order corrugation grating 15 with a constant pitch is formed in the distributed Bragg reflector region 33 on the (100) surface of the n-InP substrate 1.

Figure 25:
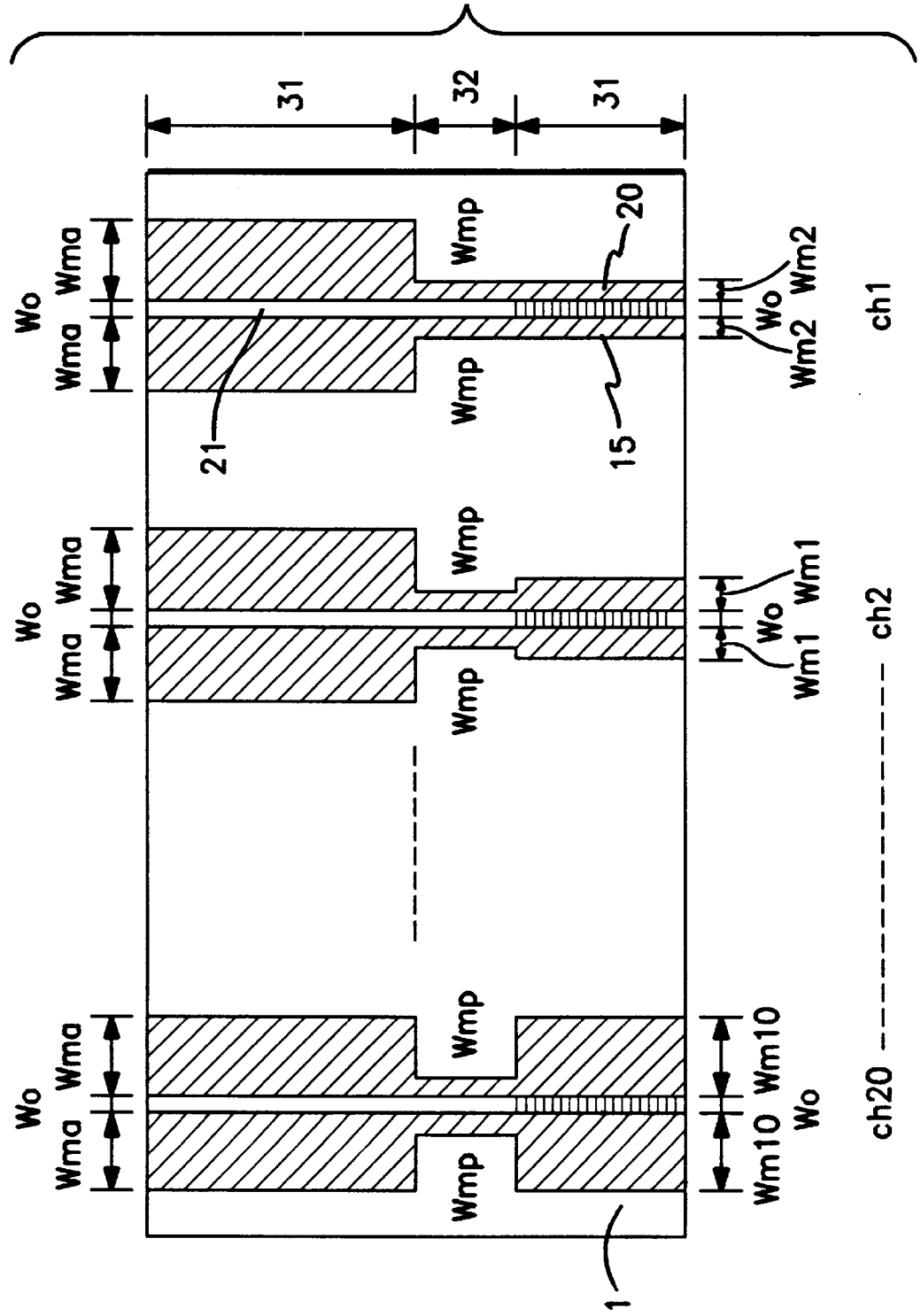
FIG. 25 is a plane view illustrative of dielectric mask patterns used for a fabrication process of laser arrays of a fifth embodiment according to the present invention.

As illustrated in FIG. 25, first to tenth pairs of dielectric stripe masks 20 are selectively formed in the active region 31, the phase control region 32 and the distributed Bragg reflector region 33. Namely, the pair of the dielectric stripe masks 20 are provided for each of the first to tenth channels ch1 to ch10. The dielectric stripe masks 20 are made of $SiO_2$. Each pair of the dielectric stripe masks 20 sandwiches and defines a first selective growth area 21. The plural pairs of the dielectric stripe masks 20 are arranged in parallel to each other along the cavity direction of the laser device or the (011) direction. In the active region 31, the dielectric stripe masks 20 have the width $W_{ma}$ of 30 micrometers in the all channels. In the phase control region 32, the dielectric stripe masks 20 also have the same width $W_{mp}$ of 4 micrometers in the all channels. In the distributed Bragg reflector region 33, the dielectric stripe masks 20 have different widths in every channels- The dielectric stripe masks 20 in the distributed Bragg reflector region 33 have a difference of 2 micrometers in width between two adjacent channels. The dielectric stripe mask width in the each channel increases by two micrometers together with an increase by one in the channel number. For example, in the first channel ch1 the dielectric stripe mask width is 4 micrometers which is the same width as that in the phase control region 32. The dielectric stripe mask width of the second channel ch2 is thus 6 micrometers. The dielectric stripe mask widths of the third to ninth channels ch3–ch9 are 8 to 20 micrometers respectively. Accordingly, the dielectric stripe mask width of the tenth channel ch10 is 22 micrometers. Each of the paired dielectric stripe masks 20 has a constant gap width $W_0$ of 1.5 micrometers. The gap width $W_0$ of the paired stripe masks 20 are the same in the all channels ch1 to ch10. The paired dielectric stripe masks 20 are used as a mask pattern for a subsequent selective metal organic vapor phase epitaxy to form multiple epitaxial layers on the selective growth area 21.

An n-InGaAsP guiding layer 2, an n-InP spacer layer 3, a non-doped multiple quantum well layer 4, a non-doped InGaAsP optical confinement layer 5 and a p-InP cladding layer 6 are sequentially and selectively grown on the n-InP substrate 1 by the metal organic vapor phase epitaxy with use of the paired dielectric stripe mask pattern 20. Each of the epitaxial layers 2, 3, 4, 5 and 6 grown on the first selective growth areas 21 has a larger thickness than that of the other areas. As described above, the thickness of the epitaxial layer grown by the metal organic vapor phase epitaxy with the stripe mask pattern is approximately proportional to the stripe mask width. The above epitaxial layers 2, 3, 5 and 6 grown on the first selective growth area 21 in the active region 31 have largest thicknesses of 150 nanometers, 100 nanometers, 200 nanometers and 500 nanometers respectively. The multiple quantum well layer 4 comprises eight i-InGaAs well layers and i-InGaAsP barrier layers. In the active region 31, each of the well layer in the multiple quantum well layer 5 has a thickness of 7 nanometers. In each the active region 31 and the phase control region 32, each thickness of the above epitaxial layers 2, 3, 4, 5 and 6 grown on the first selective growth area 21 is the same in all channels according to the same stripe mask width. In contrast, each of the thickness of the above epitaxial layers 2, 3. 4, 5 and 6 in the distributed Bragg reflector region 33 is different in each channel according to the stripe mask width therein. In the first channel ch1, the each thickness of the epitaxial layers 2, 3, 4, 5 and 6 grown on the first selective growth area 21 is the same between in the phase control region 32 and in the distributed Bragg reflector region 33. The each thickness of the epitaxial layers 2, 3, 4, 5 and 6 grown on the first selective growth area 21 increases with the increase of the mask width in the distributed Bragg reflector region 33 together with the increase of the channel number from ch1 to ch10. For example, the thickness of the each quantum well layer of the multiple quantum well layer grown in the first selective growth area 21 in the distributed Bragg reflector region 33 increases from 2.5 nanometers to 5.5 nanometers according to the increase of the stripe mask width together with the increase of the channel number from ch1 to ch10.

Both inside and outside portions of the dielectric strip mask pattern 20 are partially removed by etching until the gap width $W_0$ of the paired stripe masks 20 becomes wide up to 6 micrometers and the maximum width of each of the stripe masks 20 becomes 10 micrometers or less.

A p-InP clad layer 7 is selectively grown on the enlarged selective growth area 21 by the metal organic vapor phase epitaxy with use of the paired etched dielectric stripe mask pattern 20 to cover the mesa structure epitaxial grown layers 2, 3, 4, 5 and 6 thereby the p-InP clad layer 7 also has a mesa structure as illustrated in FIGS. 23 and 24. The p-InP clad layer 7 grown on the enlarged selective growth area 21 have a thickness of 1.5 micrometers. A p-InGaAs cap layer 8 is selectively grown on top portions of the mesa structure of the p-InP clad layer 7. The p-InP cap layer 8 has a thickness of 300 nanometer and a carrier concentration of $1\times10^{19}$ $cm^{-3}$. The p-InP cap layer 8 at the boundary areas between the active region 31, the phase control region 32 and the distributed Bragg reflector region 33 is partially removed. A dielectric film 12 made of $SiO_2$ may subsequently be formed on an entire surface of the device. Stripe windows of the dielectric $SiO_2$ film may selectively be formed on the p-InGaAs cap layer 8 in each region 31, 32 and 33. A p-side electrode 13 may be formed in the stripe windows of the dielectric $SiO_2$ film so that the p-side electrode 13 is selectively formed on the p-InGaAs cap layer 8 in the each region 31, 32 and 33. An n-side electrode 14 is formed on a bottom surface of the n-InP substrate 1.

Figure 26:
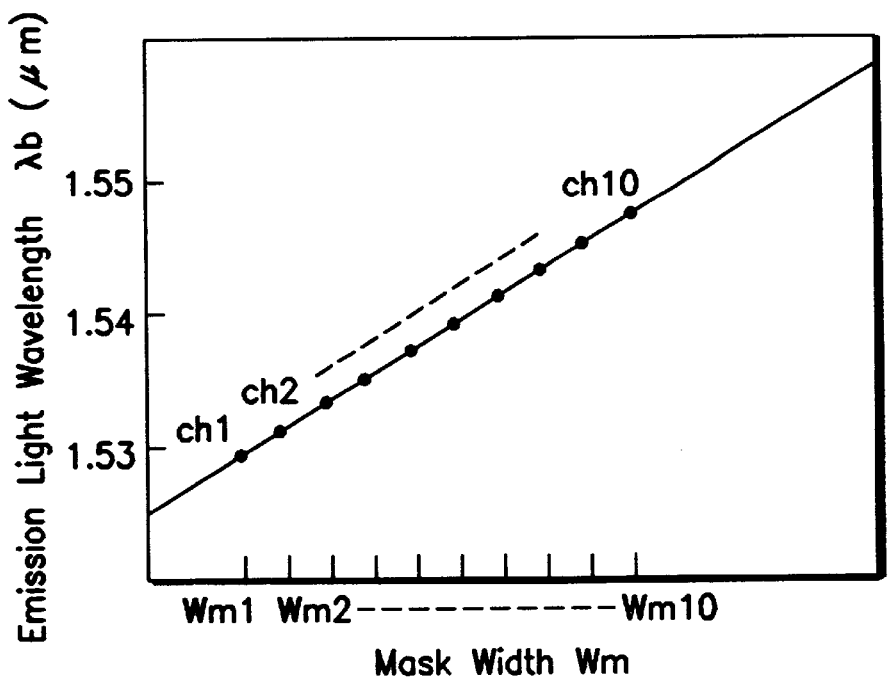
FIG. 26 is a diagram illustrative of characteristics of emission light wavelength versus mask width in laser arrays of a fifth embodiment according to the present invention.

In the distributed Bragg reflector region 33, the InGaAs/InGaAsP multiple quantum well layer 4 grown in the selective growth region 21 has a variation in both thickness and material composition among the channels. The distributed Bragg reflector semiconductor lasers in the first to tenth channels ch1 to ch10 show light outputs of different wavelengths. The distributed Bragg reflector laser in each channel shows a light emission with a current injection into the active region 31 through the p-side and n-side electrodes 13 and 14. Threshold currents of the distributed Bragg reflector lasers are varied from 8 mA to 15 mA together with the increase of the channel number between first and tenth channels ch1–ch10. The maximum output powers of the distributed Bragg reflector lasers are varied from 30 mW to 38 mW together with the increase of the channel number between first and tenth channels ch1–ch10. FIG. 26 illustrates a relationship of the light emission wavelength versus the mask width in the distributed Bragg reflector region 33, from which it is appreciated that the light emission wavelength is proportional to the mask width in the distributed Bragg reflector region 33. The light emission wavelengths of the distributed Bragg reflector lasers are varied from about 1.529 micrometers to 1.547 micrometers together with the increase of the channel number between first and tenth channels ch1–ch10. The difference in the light emission wavelengths between the first channel ch1 and the tenth channel ch10 is 18 nanometers. The difference in the light emission wavelengths between two adjacent channels is thus less than 1.8 nanometers. The light emission wavelength of the each channel is further variable with additional current injections into the phase control region 32 and the distributed Bragg reflector region 33. A variation of the light emission wavelength due to the additional current injections into the phase control region 32 and the distributed Bragg reflector region 33 is in the range of from 3.5 nanometers to 8 nanometers in the first to tenth channels. The distributed Bragg reflector laser array device with ten channels is able to possess a wide tunable range of about 20 nanometers in the light emission wavelength. A simplicity in the fabrication processes free of any etching process and complication thereof provides a high yield as well as a uniformity of excellent device performances of the fabricated laser device.

A sixth embodiment of the present invention is directed to a novel fabrication process of semiconductor optical integrated circuit including distributed Bragg reflector semiconductor laser array with optical modulator for multiple channel communication system in which distributed Bragg reflector semiconductor lasers show different photoluminescence wavelengths from each other. The device structure of the sixth embodiment is similar to that of the fifth embodiment except for the optical modulator. The semiconductor optical integrated circuit comprises a monolithic integration with ten tunable distributed Bragg reflector semiconductor laser devices of different output wavelengths arranged in parallel to each other. Each of the distributed Bragg reflector semiconductor lasers comprises an active region, a phase control region and a tuning region or a distributed Bragg reflector region.

An n-InP substrate 1 therefore comprises an active region 31, a phase control region 32, a tuning region or a distributed Bragg reflector region 33 and an optical modulator region 34. FIG. 23 illustrates the fragmentary cross sectional structure of the distributed Bragg reflector laser in the active region 31. FIG. 24 illustrates the fragmentary cross sectional structure of the distributed Bragg reflector laser in the phase control region 32. The sixth embodiment of the present invention will be described with reference to FIGS. 23, 24 and 27. The distributed Bragg reflector semiconductor laser array has ten channels of different output light wavelengths.

A first order corrugation grating 15 with a constant pitch is formed in the distributed Bragg reflector region 33 on the (100) surface of the n-InP substrate 1.

Figure 27:
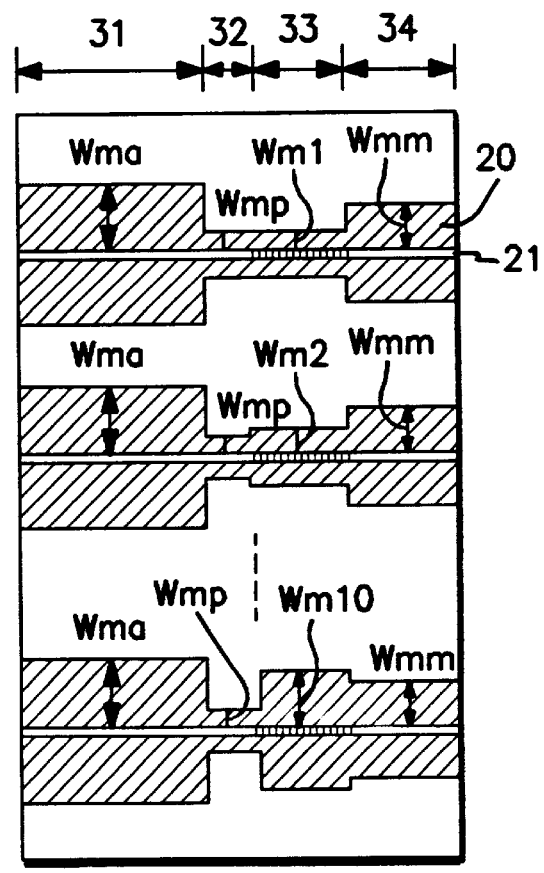
FIG. 27 is a plane view illustrative of dielectric mask patterns used for a fabrication process of laser arrays of a sixth embodiment according to the present invention.

As illustrated in FIG. 27, in each of the first to tenth channels ch1 to ch10, pairs of dielectric stripe masks 20 are selectively formed in the active region 31, the phase control region 32, the distributed Bragg reflector region 33 and the modulator region 34. Each pair of the dielectric stripe masks 20 sandwiches and defines a first selective growth area 21. The plural pairs of the dielectric stripe masks 20 are arranged in parallel to each other along the cavity direction of the laser device or the (011) direction. In the active region 31, the dielectric stripe masks 20 have the width $W_{ma}$ of 30 micrometers in the all channels. In the phase control region 32, the dielectric stripe masks 20 also have the same width $W_{mp}$ of 4 micrometers in the all channels. In the modulator region 34, the dielectric stripe masks 20 also have the same width $W_{mm}$ of 20 micrometers in the all channels. In the distributed Bragg reflector region 33, the dielectric stripe masks 20 have different widths in every channels. The dielectric stripe masks 20 in the distributed Bragg reflector region 33 have a difference of 2 micrometers in width between two adjacent channels. The dielectric stripe mask width in the each channel increases by two micrometers together with an increase by one in the channel number. For example, in the first channel ch1 the dielectric stripe mask width is 4 micrometers which is the same width as that in the phase control region 32. The dielectric stripe mask width of the second channel ch2 is thus 6 micrometers. The dielectric stripe mask widths of the third to ninth channels ch3–ch9 are 8 to 20 micrometers respectively. Accordingly, the dielectric stripe mask width of the tenth channel ch10 is 22 micrometers. Each of the paired dielectric stripe masks 20 has a constant gap width $W_0$ of 1.5 micrometers. The gap width $W_0$ of the paired stripe masks 20 are the same in the all channels ch1 to ch10. The paired dielectric stripe masks 20 are used as a mask pattern for a subsequent selective metal organic vapor phase epitaxy to form multiple epitaxial layers on the selective growth area 21, Subsequent fabrication processes are the same as those of the fifth embodiment as described above. An n-InGaAsP guiding layer 2, an n-InP spacer layer 3, a non-doped multiple quantum well layer 4, a non-doped InGaAsP optical confinement layer 5 and a p-InP cladding layer 6 are sequentially and selectively grown on the n-InP substrate 1 by the metal organic vapor phase epitaxy with use of the paired dielectric stripe mask pattern 20. Each of the epitaxial layers 2, 3, 4, 5 and 6 grown on the first selective growth areas 21 has a larger thickness than that of the other areas. The thicknesses of each of the epitaxial layers 2, 3, 4, 5 and 6 are proportional to the mask widths. The above epitaxial layers 2, 3, 5 and 6 grown on the first selective growth area 21 in the active region 31 have largest thicknesses. The thickness of each of the epitaxial layers 2, 3, 4, 5 and 6 grown on the selective growth area 21 in the modulator region 34 is smaller than that in the active region 31 and larger than that in the phase control region 32, and further smaller than that in the distributed Bragg reflector region 33 in the tenth channel ch10. The multiple quantum well layer 4 comprises eight i-InGaAs well layers and i-InGaAsP barrier layers. Each of the thickness of the above epitaxial layers 2, 3, 4, 5 and 6 in the distributed Bragg reflector region 33 is different in each channel according to the variation of the stripe mask widths. In the first channel ch1, the each thickness of the epitaxial layers 2, 3, 4, 5 and 6 grown on the first selective growth area 21 is the same between in the phase control region 32 and in the distributed Bragg reflector region 33. The each thickness of the epitaxial layers 2, 3, 4, 5 and 6 grown on the first selective growth area 21 increases with the increase of the mask width in the distributed Bragg reflector region 33 together with the increase of the channel number from ch1 to ch10. For example, the thickness of the each quantum well layer of the multiple quantum well layer grown in the first selective growth area 21 in the distributed Bragg reflector region 33 increases from 2.5 nanometers to 5.5 nanometers according to the increase of the stripe mask width together with the increase of the channel number from ch1 to ch10.

Both inside and outside portions of the dielectric strip mask pattern 20 are partially removed by etching until the gap width $W_0$ of the paired stripe masks 20 becomes wide up to 6 micrometers and the maximum width of each of the stripe masks 20 becomes 10 micrometers or less.

A p-InP clad layer 7 is selectively grown on the enlarged selective growth area 21 by the metal organic vapor phase epitaxy with use of the etched dielectric stripe mask pattern 20 to cover the mesa structure epitaxial grown layers 2, 3, 4, 5 and 6 thereby the p-InP clad layer 7 also has a mesa structure as illustrated in FIGS. 23 and 24. The p-InP clad layer 7 grown on the enlarged selective growth area 21 have a thickness of 1.5 micrometers. A p-InGaAs cap layer 8 is selectively grown on top portions of the mesa structure of the p-InP clad layer 7. The p-InP cap layer 8 has a thickness of 300 nanometer and a carrier concentration of $1 \times 10^{19}$ cm$^{-3}$. The p-InP cap layer 8 at the boundary areas between the active region 31, the phase control region 32, the distributed Bragg reflector region 33 and the modulator region 34 is partially removed. A dielectric film 12 made of $SiO_2$ may subsequently be formed on an entire surface of the device. Stripe windows of the dielectric $SiO_2$ film may selectively be formed on the p-InGaAs cap layer 8 in each region 31, 32, 33 and 34. A p-side electrode 13 may be formed in the stripe windows of the dielectric $SiO_2$ film so that the p-side electrode 13 is selectively formed on the p-InGaAs cap layer 8 in the each region 31, 32, 33 and 34. An n-side electrode 14 is formed on a bottom surface of the n-InP substrate 1. Further, an anti-reflective coating facet with dielectric multiple coating layers is provided at the modulator end potion to obtain a low facet refrectivity.

The mask width $W_{mm}$ of 20 micrometers in the modulator region 34 provides a gain peak wavelength of about 1.48 micrometers. In the distributed Bragg reflector region 33, the InGaAs/InGaAsP multiple quantum well layer 4 grown in the selective growth region 21 has a variation in both thickness and material composition among the channels. The distributed Bragg reflector semiconductor lasers in the first to tenth channels ch1 to ch10 show light outputs of different wavelengths. The distributed Bragg reflector laser in each channel shows a light emission with a current injection into the active region 31 through the p-side and n-side electrodes 13 and 14. Threshold currents of the distributed Bragg reflector lasers are varied from 12 mA to 18 mA together with the increase of the channel number between first and tenth channels ch1–ch10. The extinction ratio with application of a negative voltage −3 V to the modulator region 34 is in the range of from 15 dB to 19 dB in the first to tenth channels ch1 to ch10. A distribution of the wavelengths of the emission lights through the channels is the same as that of the fifth embodiment. Properties of the variable wavelength of the emission lights are also the same as those of the fifth embodiment. As modifications of the sixth embodiment, the mask width $W_{mm}$ in the modulator region 34 may be varied between the channels ch1 to ch10 so that absorption wavelength is matched to the light emission wavelength in each channel. The maximum output powers of the distributed Bragg reflector lasers are varied from 30 mW to 38 mW together with the increase of the channel number between first and tenth channels ch1–ch10. The light emission wavelengths of the distributed Bragg reflector lasers are varied from about 1.529 micrometers to 1.547 micrometers together with the increase of the channel number between first and tenth channels ch1–ch10. The difference in the light emission wavelengths between the first channel ch1 and the tenth channel ch10 is 18 nanometers. The difference in the light emission wavelengths between two adjacent channels is thus less than 1.8 nanometers. The light emission wavelength of the each channel is further variable with additional current injections into the phase control region 32 and the distributed Bragg reflector region 33. A variation of the light emission wavelength due to the additional current injections into the phase control region 32 and the distributed Bragg reflector region 33 is in the range of from 3.5 nanometers to 8 nanometers in the first to tenth channels. The distributed Bragg reflector laser array device with ten channels is able to possess a wide tunable range of about 20 nanometers in the light emission wavelength. A simplicity in the fabrication processes free of any etching process and complication thereof provides a high yield as well as a uniformity of excellent device performances of the fabricated laser device.

A seventh embodiment of the present invention is directed to a novel fabrication process of semiconductor optical integration with distributed Bragg reflector semiconductor laser array, optical modulator, optical coupler and optical amplifier for 4-channel communication system in which distributed Bragg reflector semiconductor lasers show different photoluminescence wavelengths from each other. The device structure of the seventh embodiment is similar to that of the sixth embodiment in the laser array and the modulator. The semiconductor optical integrated circuit comprises a monolithic integration with four tunable distributed Bragg reflector semiconductor laser devices of different output wavelengths arranged in parallel to each other. Each of the distributed Bragg reflector semiconductor lasers comprises an active region, a phase control region and a tuning region or a distributed Bragg reflector region. The optical amplifier has a window region.

An n-InP substrate 1 therefore comprises an active region 31, a phase control region 32, a tuning region or a distributed Bragg reflector region 33, an optical modulator region 34, a passive wave guide optical coupler region 35, an optical amplifier region 36 and a window region 37. FIG. 23 illustrates the fragmentary cross sectional structure of the distributed Bragg reflector laser in the active region 31. FIG. 24 illustrates the fragmentary cross sectional structure of the distributed Bragg reflector laser in the phase control region 32. The seventh embodiment of the present invention will be described with reference to FIGS. 23, 24, 28 and 29. The distributed Bragg reflector semiconductor laser array has four channels of different output light wavelengths.

A first order corrugation grating 15 with a constant pitch is formed in the distributed Bragg reflector region 33 on the (100) surface of the n-InP substrate 1.

Figure 28:
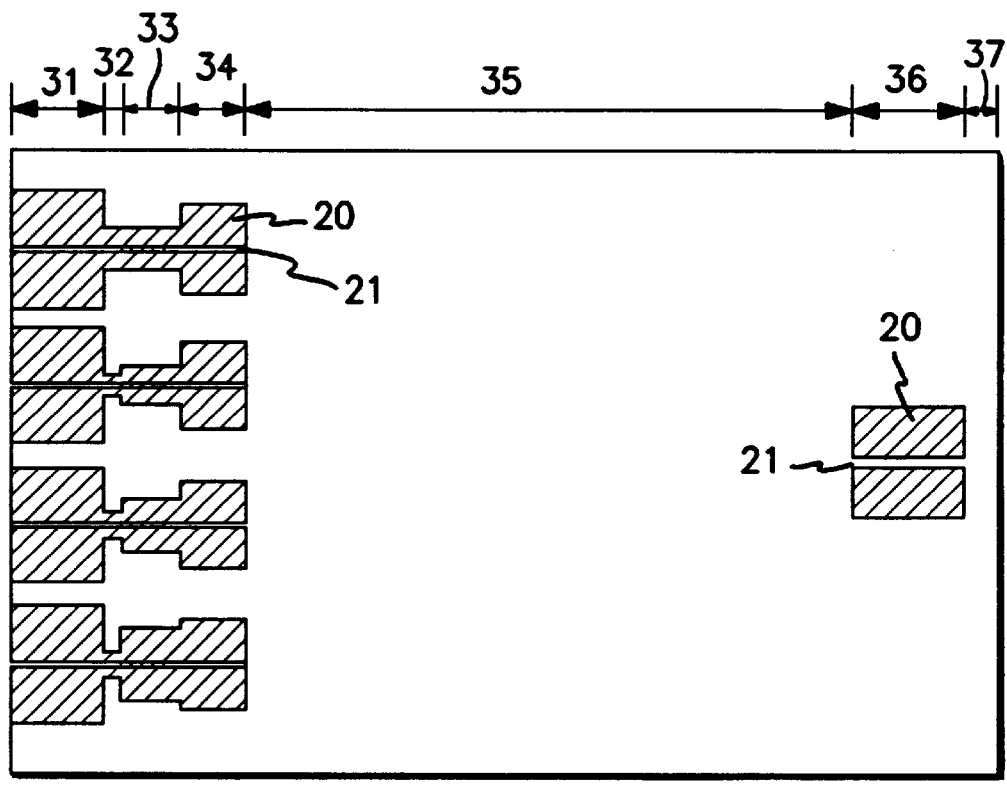
FIGS. 28 and 29 are plane views illustrative of dielectric stripe mask patterns used for fabrication processes for an optical integration device in a seventh embodiment according to the present invention.

As illustrated in FIG. 28, in each of the first to fourth channels ch1 to ch4, pairs of dielectric stripe masks 20 are selectively formed in the active region 31, the phase control region 32, the distributed Bragg reflector region 33, the modulator region 34 and the optical amplifier region 36. No mask pattern is formed in the passive wave guide optical coupler region 35 and the window region 37. Each pair of the dielectric stripe masks 20 sandwiches and defines first selective growth areas 21. In the active, phase control, distributed Bragg reflector and modulator regions 31, 32, 33 and 34, the four pairs of the dielectric stripe masks 20 are symmetrically arranged around a center axis along the cavity direction of the laser device or the (011) direction. In the optical amplifier region 36, a single pair of the dielectric stripe masks 20 is arranged along the center axis in the cavity direction or the (011) direction. In the active region 31 and the optical amplifier region 36, the dielectric stripe masks 20 have the same width $W_{ma}$ of 30 micrometers in the all channels. In the phase control region 32, the dielectric stripe masks 20 also have the same width $W_{mp}$ of 4 micrometers in the all channels. In the modulator region 34, the dielectric stripe masks 20 also have the same width $W_{mm}$ of 20 micrometers in the all channels. In the distributed Bragg reflector region 33, the dielectric stripe masks 20 have different widths in every channels. The dielectric stripe masks 20 in the distributed Bragg reflector region 33 have a difference of 2 micrometers in width between two adjacent channels. The dielectric stripe mask width in the each channel increases by a constant width together with an increase by one in the channel number. Each of the paired dielectric stripe masks 20 has a constant gap width $W_0$ of 1.5 micrometers. The gap width $W_0$ of the paired stripe masks 20 are the same in the all channels ch1 to ch4. The paired dielectric stripe masks 20 are used as a mask pattern for a subsequent selective metal organic vapor phase epitaxy to form multiple epitaxial layers including the multiple quantum well structure on the selective growth area 21.

An n-InGaAsP guiding layer 2, an n-InP spacer layer 3, a non-doped multiple quantum well layer 4, a non-doped InGaAsP optical confinement layer 5 and a p-InP cladding layer 6 are sequentially and selectively grown on the n-InP substrate 1 by the metal organic vapor phase epitaxy with use of the paired dielectric stripe mask pattern 20. Each of the epitaxial layers 2, 3, 4, 5 and 6 grown on the first selective growth areas 21 has a larger thickness than that of the passive wave guide optical coupler region 35 and the window region 37. The thicknesses of each of the epitaxial layers 2, 3, 4, 5 and 6 are proportional to the mask widths. The above epitaxial layers 2, 3, 5 and 6 grown on the first selective growth area 21 in the active region 31 have larger thicknesses than any other regions 32, 33, 34, 35, 36 and 37. In the mask free regions or the passive wave guide optical coupler region 35 and the window region 37, the thickness of each of the epitaxial layers 2, 3, 4, 5 and 6 is smallest. The thickness of each of the epitaxial layers 2, 3, 4, 5 and 6 grown on the selective growth area 21 is the same between in the active region 31 and the optical amplifier region 36. The thickness of each of the epitaxial layers 2, 3, 4, 5 and 6 grown on the selective growth area 21 in the modulator region 34 is smaller than that in the active region 31 and larger than that in the phase control region 32, and further larger than any of those in the distributed Bragg reflector region 33. The multiple quantum well layer 4 comprises i-InGaAs well layers and i-InGaAsP barrier layers. Each of the thickness of the above epitaxial layers 2, 3, 4, 5 and 6 in the distributed Bragg reflector region 33 is different in each channel according to the variation of the stripe mask widths so as to be increased with the increase of the mask width in the distributed Bragg reflector region 33 together with the increase of the channel number from ch1 to ch4.

After the dielectric strip mask pattern 20 are removed, second paired stripe masks 22 are selectively formed in the entire regions 31, 32, 33, 34, 35, 36 and 37. Each of the paired stripe masks 22 has a constant width of 10 micrometers. The second stripe mask pattern 22 comprises parallel four straight portions in the active, phase control, distributed Bragg reflector and modulator regions 31, 32, 33 and 34, an S-bending coupling portion in the passive wave guide optical coupler region 35 and a single straight portion in the optical amplifier region 36 and the window region 37. A second selective growth area 23 is sandwiched and defined by the paired dielectric stripe masks 22. The second dielectric stripe masks 22 are symmetrically arranged along the cavity direction so that a longitudinal center axis of the second selective growth area 23 corresponds to the center axis of the first selective growth area 21. In the passive wave guide optical coupler region 35, the S-bending portion of the paired stripe masks 20 is so constructed that both combinations of the first and second channels and of the third and fourth channels are accomplished and made into two combined channels for an additional combination of the two combined channels into a single channel.

Figure 29:
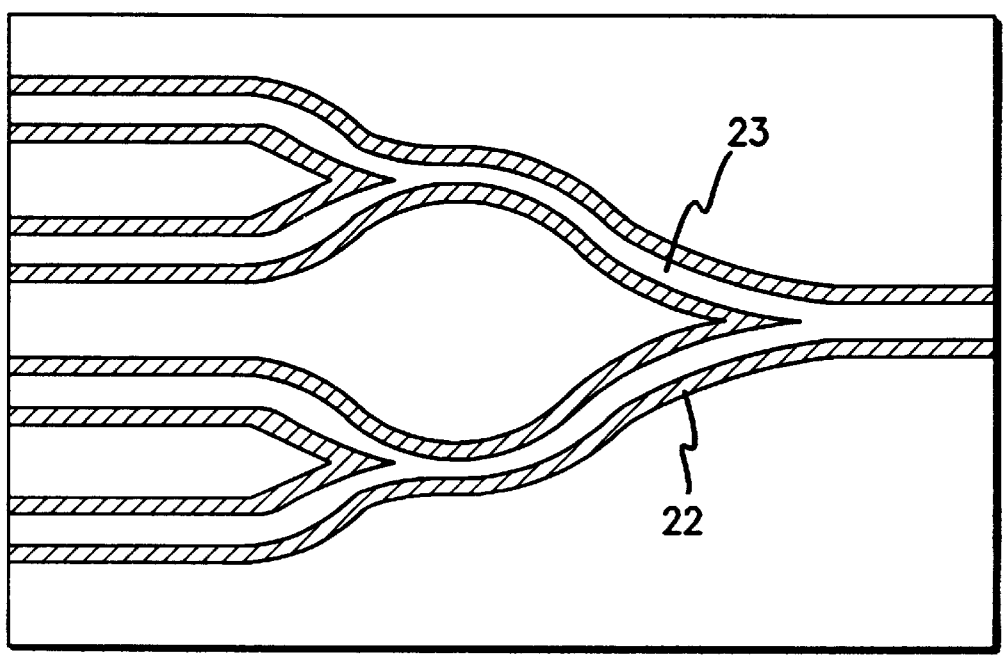

A p-InP clad layer 7 is selectively grown on the second selective growth area 23 by the metal organic vapor phase epitaxy with use of the etched dielectric stripe mask pattern 20 to cover the mesa structure epitaxial grown layers 2, 3, 4, 5 and 6 thereby the p-InP clad layer 7 also has a mesa structure as illustrated in FIGS. 23 and 24. The p-InP cladding layer 7 with the mesa structure comprises parallel four straight portions in the active, phase control, distributed Bragg reflector and modulator regions 31, 32, 33 and 34, a S-bending coupling portion in the passive wave guide optical coupler region 35 and a single straight portion in the optical amplifier region 36 and the window region 37. In the passive wave guide optical coupler region 35, the S-bending portion of the mesa structure p-InP cladding layer 7 is so constructed that the first and second channels as well as the third and fourth channels are previously accomplished and made into two combined channels for an additional combination of the two combined channels into a single channel as illustrated in FIG. 29.

A p-InGaAs cap layer 8 is selectively grown on top portions of the mesa structure of the p-InP clad layer 7, except in the passive wave guide optical coupler region 35 and the window region 37. A dielectric film 12 made of $SiO_2$ may subsequently be formed on an entire surface of the device. Stripe windows of the dielectric $SiO_2$ film may selectively be formed on the p-InGaAs cap layer 8 in each region 31, 32, 33, 34 and 36. A p-side electrode 13 may be formed in the stripe windows of the dielectric $SiO_2$ film so that the p-side electrode 13 is selectively formed on the p-InGaAs cap layer 8 in the each region 31, 32, 33, 34 and 36. An n-side electrode 14 is formed on a bottom surface of the n-InP substrate 1. Further, an anti-reflective coating facet with dielectric multiple coating layers is provided at the window region to obtain a low facet reflectivity.

A measured maximum light output power is 2.5 mW in current injection into the optical amplifier region 36. Threshold currents of the distributed Bragg reflector lasers are varied from 12 mA to 18 mA together with the increase of the channel number between first and tenth channels ch1–ch10. The extinction ratio with application of a negative voltage −3 V to the modulator region 34 is in the range of from 15 dB to 19 dB in the first to tenth channels ch1 to ch10. A distribution of the wavelengths of the emission lights through the channels is the same as that of the fifth embodiment. Properties of the variable wavelength of the emission lights are also the same as those of the fifth embodiment. A simplicity in the fabrication processes free of any etching process and complication thereof provides a high yield as well as a uniformity of excellent device performances of the fabricated laser device.

Figure 30:
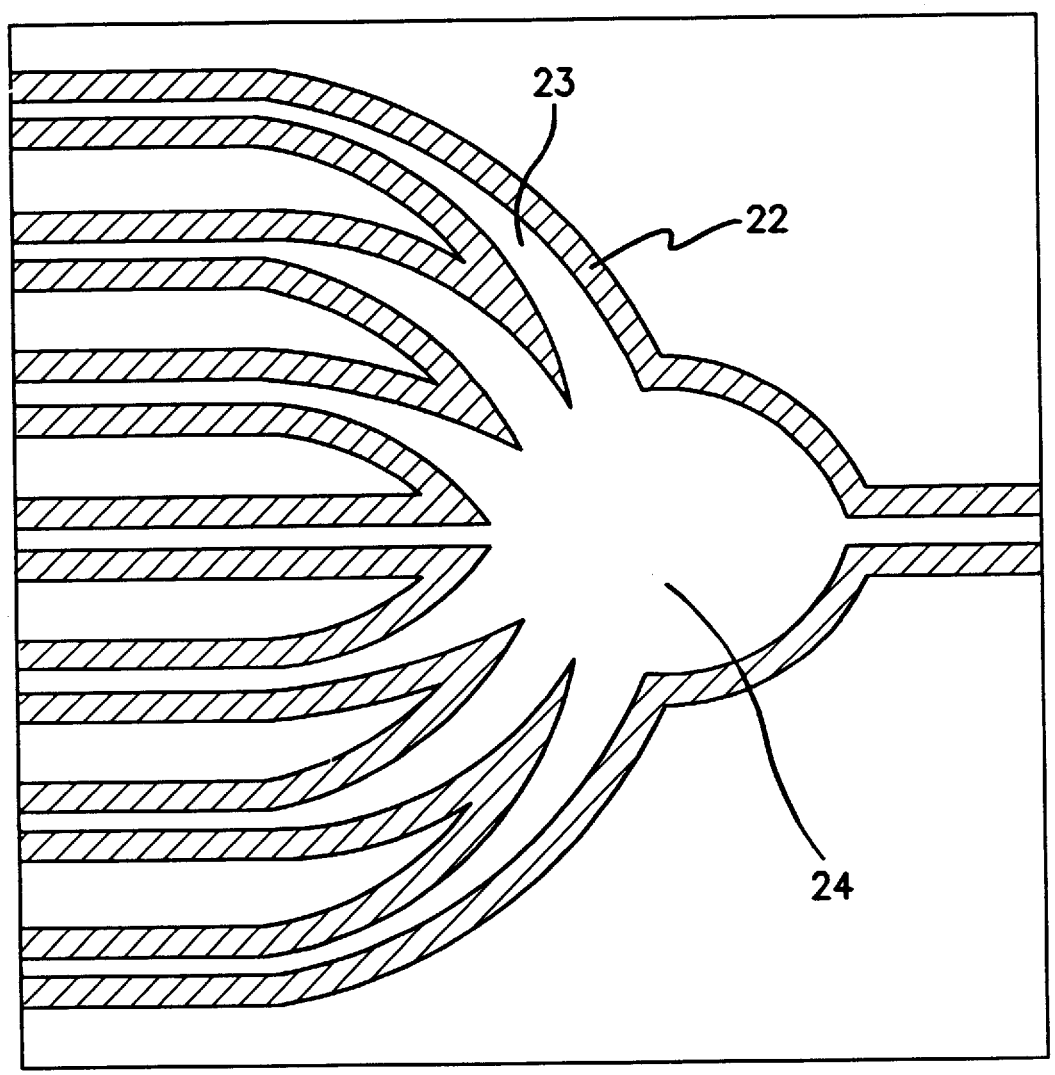
FIG. 30 is a plane view illustrative of dielectric mask patterns used for a fabrication process of a star coupler in an eighth embodiment according to the present invention.

A eighth embodiment of the present invention is a modification of the optical integration device of the seventh embodiment. The fabrication processes and the device structures of the optical integration device of the eighth embodiment are the same as those of the seventh embodiment except for both the number of channels and the configuration of the second dielectric stripe mask pattern 22. In this embodiment, the device has seven channels and a star coupler 24 in the passive wave guide optical coupler region. The second stripe masks 22 has a configuration as illustrated in FIG. 30. The seven channels are coupled into a single channel through the star coupler 24. The second dielectric masks 22 comprises parallel seven straight portions in the active, phase control, distributed Bragg reflector and modulator regions 31, 32, 33 and 34, the bending portion for the star coupler in the passive wave guide region 35 and a single straight portion in the optical amplifier region 36 and the window region 37. The mesa structure p-InP cladding layer grown on a second selective growth region defined by the second dielectric stripe mask pattern 22 also comprises parallel seven straight portions in the active, phase control, distributed Bragg reflector and modulator regions 31, 32, 33 and 34, the bending portion for the star coupler in the passive wave guide region 35 and a single straight portion in the optical amplifier region 36 and the window region 37.

A simplicity in the fabrication processes free of any etching process and complication thereof provides a high yield as well as a uniformity of excellent device performances of the fabricated laser device.

Figure 31:
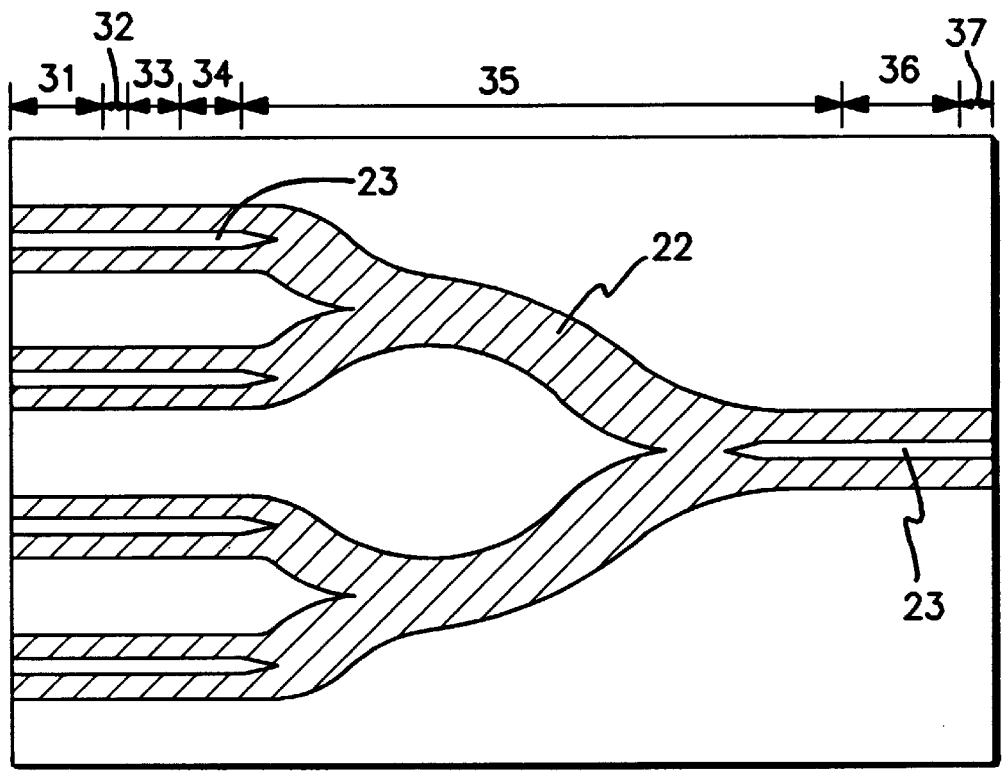
FIGS. 31 and 32 are plane views illustrative of dielectric stripe mask patterns used for fabrication processes for an optical integration device in a ninth embodiment according to the present invention.

A ninth embodiment of the present invention is a further modification of the optical integration device of the seventh embodiment. The fabrication processes and the device structures of the optical integration device of the eighth embodiment are the same as those of the seventh embodiment except for the second dielectric stripe mask pattern 22. In this embodiment, fabrication processes before the preparation of the second stripe mask pattern 22 are the same as those of the seventh embodiment, for which reason the description therefor will be omitted. As illustrated in FIG. 31, the configuration of the second stripe mask pattern 22 has the same structure as that in the active, phase control, distributed Bragg reflector, modulator, optical amplifier arid window regions 31, 32, 33, 34 and 37. The configuration of the second stripe mask pattern 22 in the passive wave guide optical coupler region 35 is different from that of the seventh embodiment. In the passive wave guide optical coupler region 35. The gap width of the second dielectric stripe masks 22 is zero. Namely the second dielectric stripe mask 22 in the region 35 comprises gap free S-bending stripe portion whose width is the same as the width of the outside of the paired stripe masks 22 of the seventh embodiment. Namely, selective growth areas 23 are defined by the second stripe masks 22 in the regions 31, 32, 33, 34, 36 and 37 except in the passive wave guide optical coupler region 35. The alignment position of the second dielectric stripe masks 22 on the semiconductor substrate is the same as that of the seventh embodiment. After the alignment of the second dielectric strip masks 22, p-InP cladding layer and p-InGaAs cap layer are in turn grown on the second selective growth area 23 by the metal organic vapor phase epitaxy with use of the second dielectric stripe mask pattern 22. The p-InP cladding layer and p-InGaAs cap layer grown on the second selective growth areas 23 have the mesa structure. No mesa structure of the p-InP cladding layer and p-InGaAs cap layer is grown in the passive wave guide optical coupler region 35.

Figure 32:
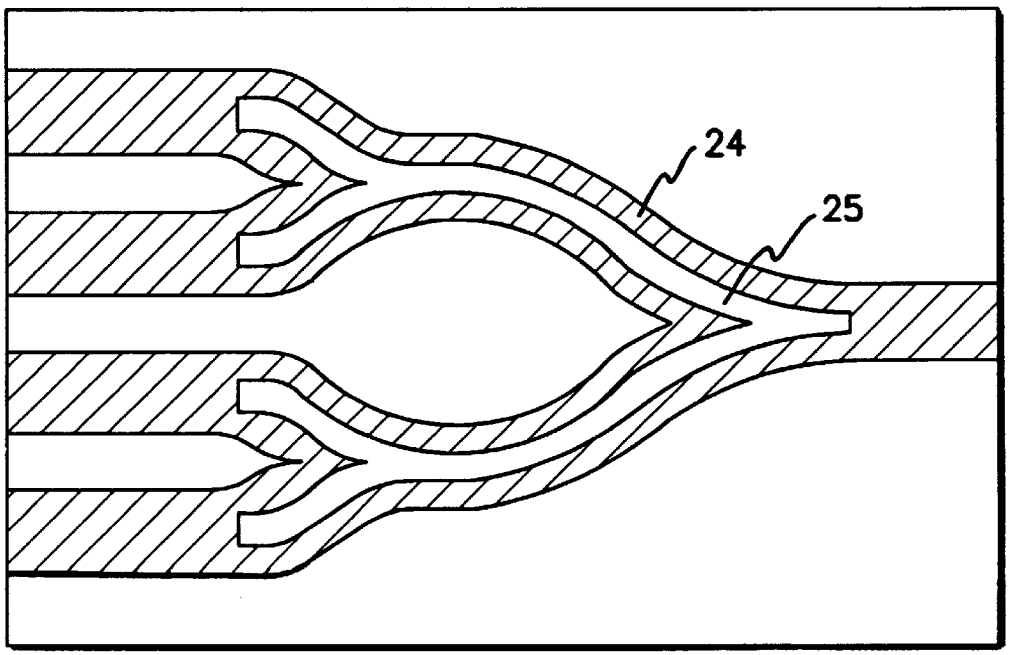

After the epitaxial growth of the p-InP cladding layer and p-InGaAs cap layer, the second dielectric stripe mask pattern 22 is removed. A third dielectric stripe mask pattern 24 as illustrated in FIG. 24 is subsequently prepared. The third dielectric stripe mask pattern 24 comprises S-bending portion with a gap of a constant width in the passive wave guide optical coupler region 35, four separated straight gap free portions in the active, phase control, distributed Bragg reflector and modulator regions 31, 32, 33 and 34 and a single straight gap free portion in the optical amplifier, window regions 36 and 37. A third selective growth area 25 is defined by the third dielectric stripe mask pattern 24 in the passive wave guide optical coupler region 35 only as illustrated in FIG. 32. A non-doped i-InP cladding layer is subsequently grown on the third selective growth area 25 by the metal organic vapor phase epitaxy with use of the third dielectric stripe mask pattern 24. The i-InP cladding layer grown on the third selective growth areas 25 have the mesa structure. No mesa structure of the i-InP cladding layer is grown in the regions 31, 32, 33, 34, 36 and 37 except in the passive wave guide optical coupler region 35. In the passive wave guide optical coupler region 35, the mesa structure i-InP cladding layer grown on the third selective growth area 25 permits a reduction of absorption efficiency thereof being able to provide a reduction of the wave guide loss, thereby resulting in a greater optical output power with a low injection current.

As modifications of the seventh to ninth embodiments, it is available to the first dielectric stripe masks 22 used for growth of the epitaxial layers including the multiple quantum well structure by the selective metal organic vapor phase epitaxy after the growth processes of the n-InGaAs guiding layer 2 and the n-InP spacer layer 3 on the entire surface of the n-InP semiconductor substrate 1.

As further modifications of the above embodiments, it is available to make a variation of the growth pressure for every epitaxial layer growth processes. As described above with reference to FIG. 22, the variation of the growth pressure in growing the epitaxial layer provides a variation of differential constant of the proportional relationship of the growth rate versus the stripe mask width. When a large variation of the thickness of the epitaxial layer is required, a high growth pressure is used. When a small variation of the thickness of the epitaxial layer is required, a low growth pressure is used. For example, the epitaxial growth for the multiple quantum well layer is conduced under a high growth pressure so that the gain peak wavelength thereof in the distributed Bragg reflector region is sufficiently smaller than the emission light wavelength. The epitaxial growth for the guiding layer and the optical confinement layer is conduced under a low growth pressure so as to secure a sufficient thickness for obtaining a necessary optical confinement coefficient in the most thin layer region such as passive regions.

Figure 33:
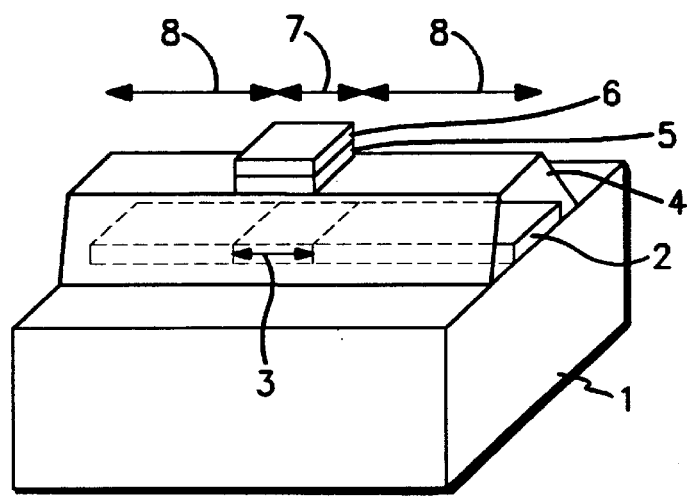
FIG. 33 is a perspective view illustrative of an optical amplifier gate switching device of a tenth embodiment according to the present invention.
Figure 34:
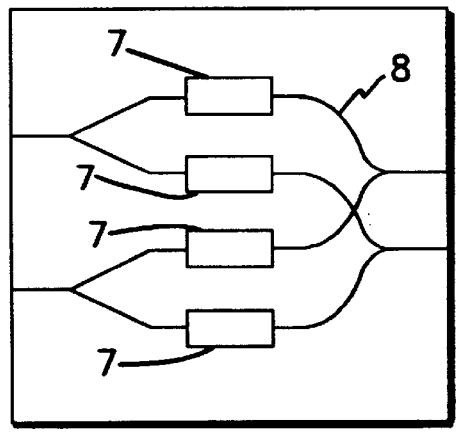
FIG. 34 is a plane view illustrative of optical amplifier gate switching arrays of a tenth embodiment according to the present invention.

A tenth embodiment according to the present invention is directed to a novel fabrication process for a semiconductor laser amplifier gate switch array monolithically integrated on a semiconductor substrate. The structure of the semiconductor laser amplifier gate switch array will be described with reference to FIGS. 33 and 34. As illustrated in FIG. 34, laser amplifier gate switch arrays with 2×2 matrix structure are monolithically integrated on an n-InP substrate 1. The laser amplifier gate switch arrays comprises four gate portions 7 which are arranged in parallel to each other and wavelength division multiplexing wave guides 8, both of which are monolithically integrated on the n-InP substrate 1.

The n-InP semiconductor substrate 1 comprises a gate region 7 and wavelength division multiplexing wave guide regions 8. In the gate region 7, a non-doped i-InGaAsP active wave guide layer 3 of 1.3 wavelength composition is formed on the n-InP substrate 1. In the wavelength division multiplexing wave guide regions 8, a non-doped i-InGaAsP passive wave guide layer 2 of 1.15 wavelength composition is formed on the n-InP substrate 1. The InGaAsP active and passive wave guide layers 3 and 2 are arranged in a line along a center axis in the wave guide direction and smoothly coupled to each other as illustrated in FIG. 33. A p-InP cladding layer 4 is formed in the gate region 7 and the wavelength division multiplexing wave guide region 8 to cover the InGaAsP active and passive wave guide layers 3 and 2. The p-InP cladding layer 4 has a mesa structure. A p-InGaAs cap layer 5 is formed on a top portion of the p-InP cladding layer 4 in the gate region 7 only. An Au/Ti metal layer 6 serving as a p-side electrode is formed on the p-InGaAsP cap layer 5.

Figure 35A:
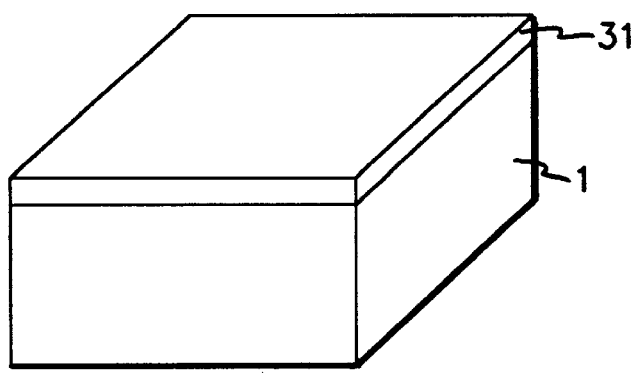
Figure 35B:
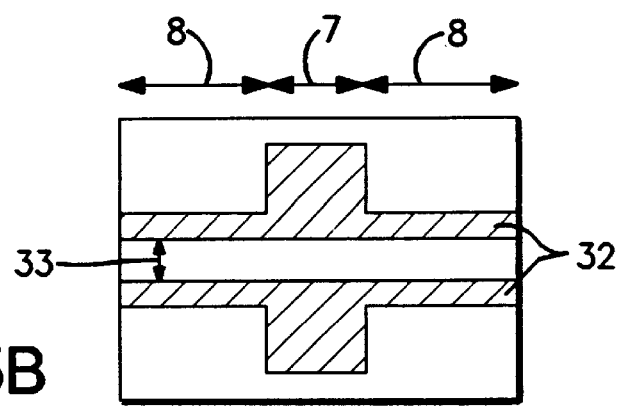

The fabrication processes of the semiconductor laser amplifier gate switch array will be described with reference to FIGS. 35A to 35D. As illustrated in FIG. 35A, a $SiO_2$ dielectric film 31 with a thickness of about 1000 angstroms is deposited on an entire surface of the n-InP substrate 1 by a thermal chemical vapor deposition method. The deposited $SiO_2$ film 31 is subjected to photolithography process to be made into a pair of $SiO_2$ stripe masks 32 to be used as a mask pattern in a subsequent selective metal organic vapor phase epitaxy as illustrated in FIG. 35B. Each of the paired $SiO_2$ stripe mask pattern 32 comprises a wider portion in the gate region 7 and narrower portions in the wavelength division multiplexing wave guide regions 8. A longitudinal length of the wider portion of the each $SiO_2$ stripe mask 32 is 500 micrometers. The wider portion of the paired $SiO_2$ stripe mask pattern 32 has a width of 30 micrometers. The narrower portion of the paired $SiO_2$ stripe mask pattern 32 has a width of 5 micrometers. A gap width of the paired $SiO_2$ stripe mask pattern 32 is 1 micrometer. The paired $SiO_2$ stripe masks 32 sandwich and define a first selective growth area 33. As illustrated in FIG. 35C, the non-doped i-InGaAsP active and passive wave guide layers 3 and 2 are simultaneously grown on the first selective growth area 33 by a selective metal organic vapor phase epitaxy with use of the $SiO_2$ stripe mask pattern 32. The i-InGaAsP active wave guide layer 3 and the passive wave guide layer 2 are formed in the gate region 7 and in the wavelength division multiplexing wave guide regions 8 respectively. The i-InGaAsP active and passive wave guide layers 3 and 2 have wavelength compositions of 1.3 micrometers and 1.15 micrometers respectively. The i-InGaAsP active and passive wave guide layers 3 and 2 have thicknesses of about 2000 angstroms. The $SiO_2$ stripe mask pattern 32 is subsequently subjected to a photolithography process so that inside portions of the paired stripe masks 32 are removed. The first $SiO_2$ stripe mask pattern 32 is made into a second $SiO_2$ stripe mask pattern with a gap width of about 7 micrometers, which is not illustrated. The second $SiO_2$ stripe mask pattern sandwiches and defines a second selective growth area not illustrated. As illustrated in FIG. 35D, the p-InP cladding layer 4 and the p-InGaAs cap layer 5 are in turn grown on the second selective growth area by the metal organic vapor phase epitaxy with use of the second $SiO_2$ stripe mask pattern. The p-InP cladding layer 4 and the p-InGaAs cap layer 5 have thicknesses of 1 micrometer and 2000 angstroms respectively. The p-InP cladding layer 4 has a mesa structure The p-InGaAs cap layer 5 only in the wavelength division multiplexing wave guide regions 8 is partially removed so that the p-InGaAs cap layer 5 remains only in the gate region 7. The Au/Ti metal layer 6 acting as the p-side electrode is evaporated on the p-InGaAs cap layer 5 by an electron beam evaporation method. It is selective whether or not the second SiO$_2$ stripe mask pattern is removed.

The active and passive wave guide layers 3 and 2 are smoothly coupled so that the entire of the light is able to be transmitted between the passive wave guide layer 2 and the active wave guide layer 3. No coupling loss appears at the coupling portions of the active and passive wave guide layers 3 and 2. All of the light is able to be transmitted from the passive wave guide layer 2 into the active wave guide layer 3 to be subjected to a gate-ON operation with a current injection into the gate region 35 through the Au/Ti metal electrode. This permits a large amplification by the gate-ON operation in the gate region 35 thereby resulting in a necessary small injection current for the gate-ON operation. As described above, the active and passive wave guide layers 3 and 2 are simultaneously grown by the single growth process. The simplicity of the fabrication process free from any etching process is able to provide a high yield and a uniformity in the device performances. The active and passive guide layers 3 and 2 have smooth side walls free from any surface roughness thereby being able to prevent any scattering losses and permit a small injection current for the gate-ON performance.

Figure 38:
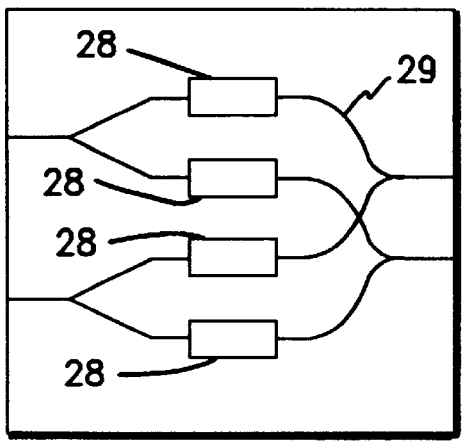
FIG. 38 is a plane view illustrative of optical amplifier gate switching arrays of an eleventh embodiment according to the present invention.

An eleventh embodiment according to the present invention is directed to a novel fabrication process for a semiconductor laser amplifier gate switch array monolithically integrated on a semiconductor substrate. The structure of the semiconductor laser amplifier gate switch array will be described with reference to FIGS. 36, 37 and 38. Laser amplifier gate switch arrays with 2×2 matrix structure are monolithically integrated on an n-InP substrate 1. The laser amplifier gate switch arrays comprise four gate portions 28 which are arranged in parallel to each other and wavelength division multiplexing wave guides 29, both of which are monolithically integrated on the n-InP substrate 1. The n-InP semiconductor substrate 1 comprises a gate region 28 and wavelength division multiplexing wave guide regions 29. In the gate region 28, a non-doped i-InGaAsP active wave guide layer 23 of 1.3 wavelength composition is selectively formed on only a longitudinal center portion on the n-InP substrate 1. In the wavelength division multiplexing wave guide regions 29, a non-doped InGaAsP passive wave guide layer 22 and a p-InP first cladding layer 24 are in turn formed on an entire surface of the n-InP semiconductor substrate 1, except in the gate region 28. The non-doped i-InGaAsP passive wave guide layer 22 has a 1.15 wavelength composition. The InGaAsP active and passive wave guide layers 23 and 22 are arranged in a line along a center axis in the wave guide direction and smoothly coupled to each other. The width of the passive wave guide layers 22 is the same as that of the n-InP semiconductor substrate 1 and the width of the active wave guide layer 23 is sufficiently smaller than that of the passive wave guide layer 22 as illustrated in FIG. 36. A p-InP second cladding layer 25 is selectively formed in the gate region 28 and the wavelength division multiplexing wave guide region 29 along a longitudinal center axis portion to cover the InGaAsP active layer 23 and a longitudinal center part of passive wave guide layers 22. The p-InP cladding layer 25 has a mesa structure. A p-InGaAs cap layer 26 is formed on a top portion of the mesa structure p-InP cladding layer 25 in the gate region 28 only. An Au/Ti metal layer 27 serving as a p-side electrode is formed on the p-InGaAsP cap layer 26. The wavelength division multiplexing wave guide region 29 has a strip loaded wave guide structure.

The fabrication processes of the semiconductor laser amplifier gate switch array will be described with reference to FIGS. 39A to 39E. As illustrated in FIG. 39A, a SiO$_2$ dielectric film 31 with a thickness of about 1000 angstroms is deposited on an entire surface of the n-InP substrate 1 by a thermal chemical vapor deposition method. The deposited SiO$_2$ film 31 is subjected to photolithography process so that a pair of SiO$_2$ stripe masks 42 is selectively formed in the gate region 28 only to be used as a mask pattern in a subsequent selective metal organic vapor phase epitaxy as illustrated in FIG. 39B. Each of the paired SiO$_2$ stripe mask pattern 32 comprises a single straight portion whose width is 30 micrometers. The SiO$_2$ film is completely removed but only in the wavelength division multiplexing wave guide regions 29. A longitudinal length of the wider portion of the each SiO$_2$ stripe mask 42 is 500 micrometers. A gap width of the paired SiO$_2$ stripe mask pattern 42 is 1 micrometer. The paired SiO$_2$ stripe masks 42 sandwich and define a first selective growth area 43.

Figure 39E:
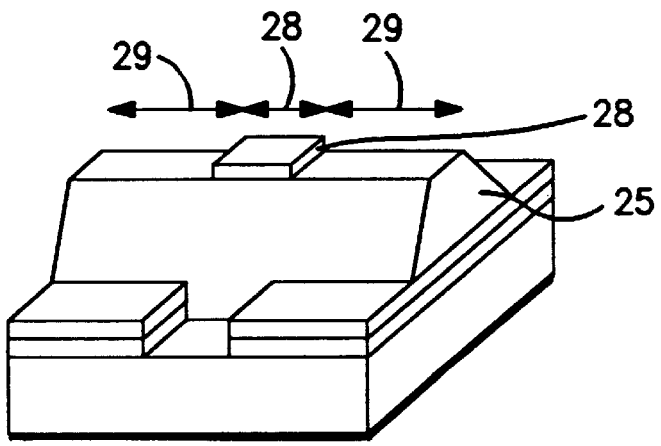
FIGS. 39A to 39D are views illustrative of optical amplifier gate switching devices in fabrication steps of a eleventh embodiment according to the present invention.
Figure 39A:
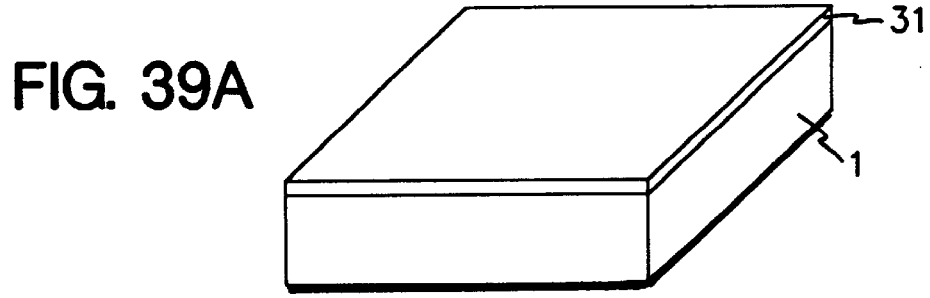
Figure 39B:
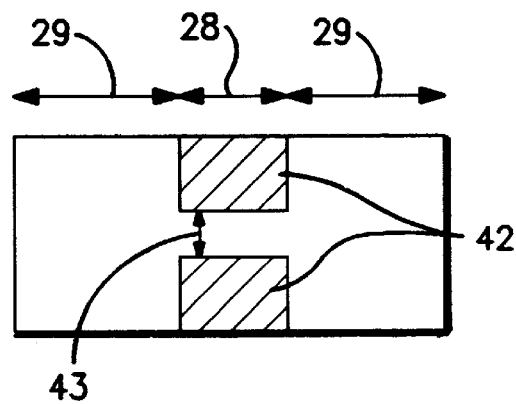
Figure 39C:
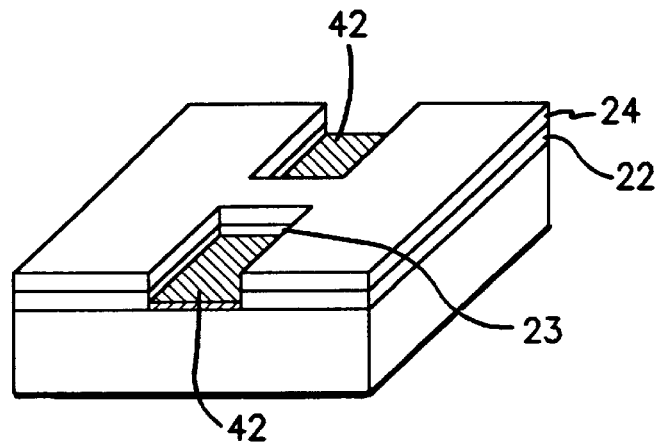

As illustrated in FIG. 39C, the non-doped i-InGaAsP active and passive wave guide layers 23 and 22 are simultaneously grown by a selective metal organic vapor phase epitaxy with use of the SiO$_2$ stripe mask pattern 42. The i-InGaAsP active wave guide layer 23 is selectively grown on the first selective growth area 43 in the gate region 28. The passive wave guide layer 22 are grown in the entire of the wavelength division multiplexing wave guide regions 29. The i-InGaAsP active and passive wave guide layers 23 and 22 Slave wavelength compositions of 1.3 micrometers and 1.15 micrometers respectively. The i-InGaAsP active and passive wave guide layers 23 and 22 have thicknesses of about 2000 angstroms. The p-InP first cladding layer 24 is grown on the active and passive wave guide layers 23 and 22 by the selective metal organic vapor phase epitaxy with use of the SiO$_2$ stripe mask pattern 42. In the gate region 28, the p-InP cladding layer is selectively selectively grown on the first selective growth area 43 sandwiched by the first SiO$_2$ stripe mask pattern 42. In the wavelength division multiplexing wave guide regions 29 is inselectively grown in the entire of the above region 29.

Figure 39D:
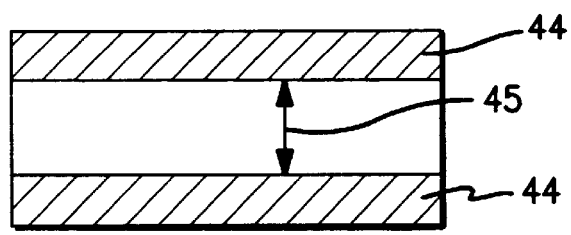

After the paired SiO$_2$ stripe mask pattern 42 is removed, a fresh SiO$_2$ film is deposited on an entire surface of the device. The deposited fresh SiO$_2$ mask is patterned into paired second stripe masks 44, each of which has a constant width in the entire regions 28 and 29 as illustrated in FIG. 39D. The paired SiO$_2$ stripe masks 44 are aligned in parallel to each other along the longitudinal wave guide direction. A gap width of the second SiO$_2$ stripe mask pattern 44 is 7 micrometers.

As illustrated in FIG. 39E, the p-InP cladding layer 25 and the p-InGaAs cap layer 26 are in turn grown on the second selective growth area 45 by the metal organic vapor phase epitaxy with use of the second SiO$_2$ stripe mask pattern 44. The p-InP cladding layer 25 and the p-InGaAs cap layer 26 have thicknesses of about 1 micrometer and about 2000 angstroms respectively. The p-InP cladding layer 25 has the mesa structure. The p-InGaAs cap layer 26 only in the wavelength division multiplexing wave guide regions 29 is partially removed so that the p-InGaAs cap layer 26 remains only in the gate region 28, The Au/Ti metal layer not illustrated for acting as the p-side electrode is evaporated on the p-InGaAs cap layer 26 by an electron beam evaporation method. It is selective whither or not the second SiO$_2$ stripe mask pattern 44 is removed.

The active and passive wave guide layers 23 and 22 are smoothly coupled so that all of the light is able to be transmitted between the passive wave guide layer 22 and the active wave guide layer 23. No coupling loss appears at the coupling portions of the active and passive wave guide layers 23 and 22. All of the light is able to be transmitted from the passive wave guide layer 22 into the active wave guide layer 23 to be subjected to a gate-ON operation with a current injection into the gate region 28 through the Au/Ti metal electrode. This permits a large amplification by the gate-ON operation in the gate region 28 thereby resulting in a necessary small injection current for the gate-ON operation. As described above, the active and passive wave guide layers 23 and 22 are simultaneously grown by the single growth process. The simplicity of the fabrication process free from any etching process is able to provide a high yield and a uniformity in the device performances. The active and passive guide layers 23 and 22 have smooth side walls free from any surface roughness thereby being able to prevent any scatting losses and permit a small injection current for the gate-ON performance. The wavelength division multiplexing wave guides has the strip loaded structure in the passive wavelength division multiplexing wave guide regions 29. The strip loaded structure of the passive wave guide permits a strong lateral optical confinement and a low radiation loss in the S-bending portion of the passive wave guide thereby allowing a considerable reduction of the gate injection current.

As the modification of the tenth and eleventh embodiments, the width of each of the first $SiO_2$ stripe mask may be more wide so that the active wave guide layer 23 show an emission of light of much longer wavelength. It is possible that the active wave guide layer has a 1.55 micrometer wavelength composition.

Figure 41:
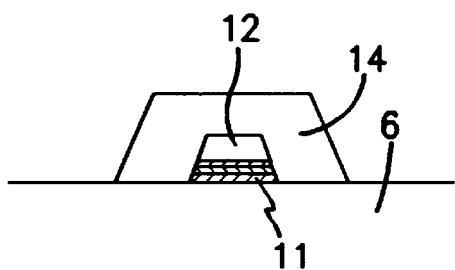
FIGS. 41 and 42 are fragmentary cross sectional elevation views illustrative of an optical integration device in a twelfth embodiment according to the present invention.
Figure 42:
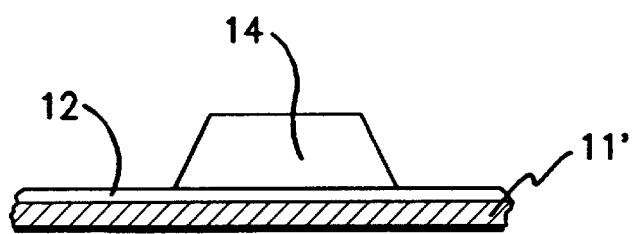
Figure 40:
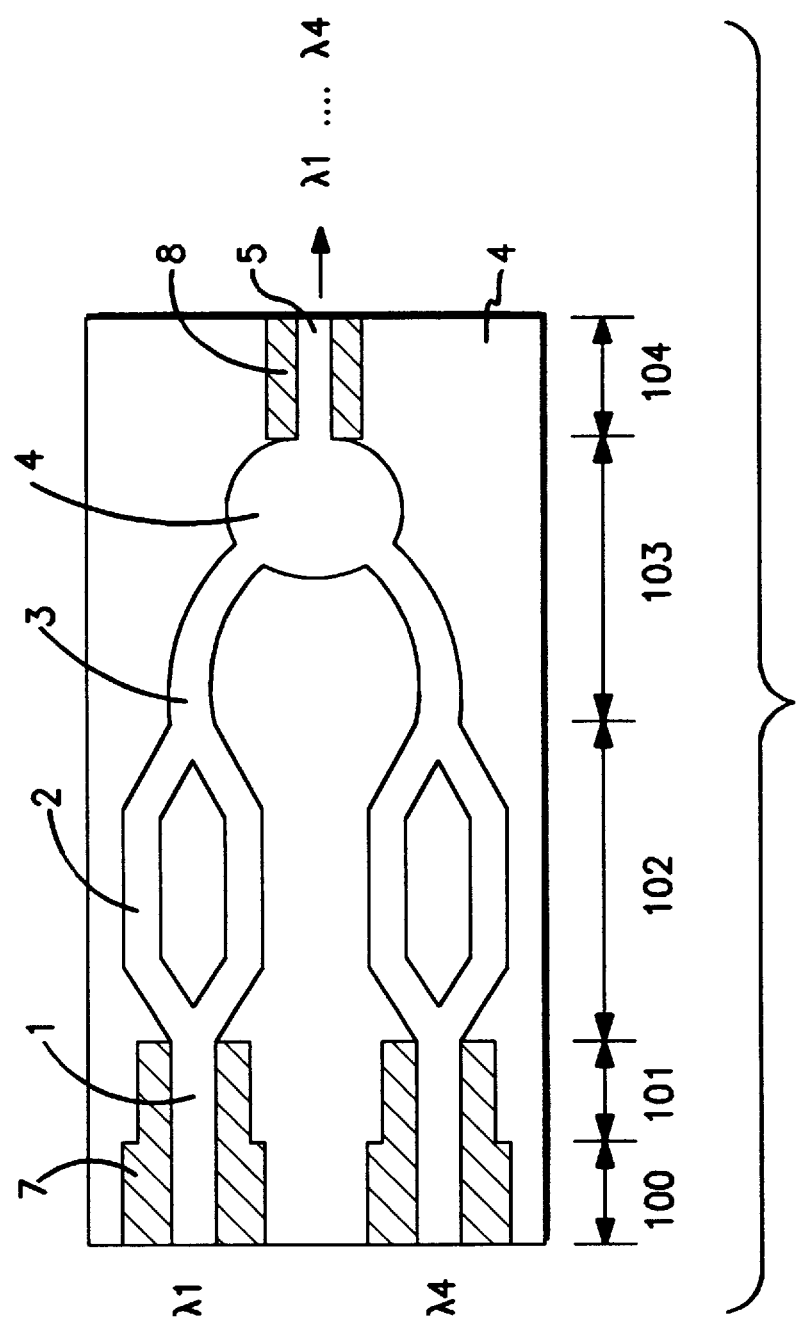
FIG. 40 is a plane view illustrative of dielectric stripe mask patterns used for a fabrication process of an optical integration device in a twelfth embodiment according to the present invention.

A twelfth embodiment of the present invention is directed to a 4-channel optical integrated circuit device including Distributed Bragg reflector lasers 1, Mach-Zehnder modulators 2, a passive wave guide optical coupler comprising bending portions 3 and a star coupler 4 and a single optical amplifier 5 which are monolithically integrated in a semiconductor substrate as illustrated in FIGS. 40, 41 and 42. The first to fourth Distributed Bragg reflector lasers 1 are provided in parallel to each other in the first to fourth channels respectively. The first to fourth Mach-Zehnder optical modulators 2 are also provided in parallel to each other in the first to fourth channels respectively. The first to fourth distributed Bragg reflector lasers 1 are coupled in series to the first to fourth Mach-Zehnder optical modulators 2 respectively in each of the first to fourth channels. The first to fourth Mach-Zehnder optical modulators 2 are coupled through passive wave guide bending portions 3 and the star coupler 4 into the single optical amplifier 5 so that the first to fourth channels are combined into a single channel through the passive wave guide bending portions 3 and the star coupler 4.

The lights with different wavelength are emitted from the first to fourth distributed Bragg reflector lasers 1 to be injected into the first to fourth Mach-Zehnder optical modulators 2 so that the injected lights are respectively subjected to optical intensity modulations. The intensity-modulated lights in the first to fourth channels are transmitted through the passive wave guide banding portions 3 into the star coupler 4 thereby the four channel different wavelength lights are multiplexed. The multiplexed wavelength light is transmitted into the single optical amplifier 5 to be subjected to an amplification of the light intensity for a subsequent high power and wide range optical output.

The fabrication processes of the optical integrated device will be described. An n-InP semiconductor substrate 6 comprises an active region 100, a distributed Bragg reflector region 101, a Mach-Zehnder optical modulator region 102, a passive wave guide region 103 and an optical amplifier region 104. Longitudinal lengths along the cavity direction of the active region 100, the distributed Bragg reflector region 101, the Mach-Zehnder optical modulator region 102, the passive wave guide region 103 and the optical amplifier region 104 are 400 micrometers, 200 micrometers, 600 micrometers, 1400 micrometers and 600 micrometers respectively. A first-order corrugation grating is partially formed in the distributed Bragg reflector region 101 on the n-InP semiconductor substrate 6. First dielectric stripe masks 7 are selectively formed in the active and distributed Bragg reflector regions 100 and 101 as illustrated in FIG. 40. The first dielectric stripe masks 7 are provided in parallel to each other along the cavity direction in each of the first to fourth channels. Each of the paired first stripe masks 7 comprises a wide portion with a width of 15 micrometers in the active region 100 and a narrow portion with a width of 8 micrometers in the distributed Bragg reflector region 101. Longitudinal lengths of the wide portion and the narrow portion of the each first dielectric stripe mask 7 are 400 micrometers and 200 micrometers respectively. Each of the paired first dielectric stripe masks 7 has a constant gap width of 1.5 micrometers to sandwich and define first selective growth areas in the respective first to fourth channels. Simultaneously, a single pair of second dielectric masks 8 is provided in the optical amplifier region 104 along a center axis in the cavity direction. Each of the paired dielectric stripe masks 8 has a constant width of 15 micrometers and a longitudinal length of 600 micrometers as well as a constant gap width of 1.5 micrometers. The paired dielectric stripe masks 8 sandwiches and defines a second selective growth area on an output side single channel in the optical amplifier region 104. The first and second dielectric stripe masks 7 and 8 may be made of $SiO_2$. The first and second dielectric stripe masks 7 and 8 are used as mask patterns for a subsequent selective epitaxial growth by the metal organic vapor phase epitaxy. The Mach-Zehnder optical modulator region 102 and the passive wave guide region 103 are free from any dielectric stripe mask pattern.

A multiple quantum well wave guide layer 11 is grown by the metal organic vapor phase epitaxy with use of the first and second dielectric stripe masks 7 and 8. In the active region 100 and the distributed Bragg reflector region 101, the multiple quantum well wave guide layer 11 is selectively grown on the first selective growth areas sandwiched between the paired first dielectric stripe masks 7 in each of the first to fourth channels. In the optical amplifier region 104, the multiple quantum well wave guide layer 11 is selectively grown on the second selective growth areas sandwiched between the paired second dielectric stripe masks 7 in the single output side channel. In the Mach-Zehnder optical amplifier region 102 and the passive wave guide region 103, the multiple quantum well wave guide layer 11 is inselectively grown on the entire of the mask free regions 102 and 103. The multiple quantum well layer 11 comprises non-doped InGaAs well layers and non-doped InGaAsP barrier layers. The InGaAsP barrier layers has a 1.2 micrometers wavelength composition. The thickness and the photoluminescence peak wavelength of the multiple quantum well wave guide layer 11 are respectively proportional to the mask width. The multiple quantum well wave guide layer 11 has the largest thickness on the first selective growth areas in the active region 100 and on the second selective growth area in the optical amplifier region 104. The thickness of the multiple quantum well wave guide layer 11 grown on the first selective growth area in the distributed Bragg reflector region 101 is smaller than the thickness thereof in the active and optical amplifier regions. The multiple quantum well wave guide layer 11 has the smallest thickness in the mask free regions or the Mach-Zehnder optical modulator region 102 and the passive wave guide region 103. The each well and barrier layers involved in the multiple quantum well wave guide layer in the mask free regions or in the Mach-Zehnder optical modulator region 102 and the passive wave guide region 103 have the same thickness of 60 angstroms. The multiple quantum well wave guide layer 11 has the different wavelength compositions between the regions. In the active region 100 and the optical amplifier region 104, the wavelength composition of the multiple quantum well wave guide layer 11 is 1.55 micrometers. In the distributed Bragg reflector region 101, the wavelength composition is 1.48 micrometers. In the mask free regions or the Mach-Zehnder optical modulator region 102 and the passive wave guide region 103, the wavelength composition is 1.40 micrometers. From the above, it could readily be appreciated that the photoluminescence peak wavelength or the emission light wavelength in the mask free regions or the Mach-Zehnder optical modulator region 102 and the passive wave guide region 103 is sufficiently small as compared to that in the active region 100 and the optical amplifier region 104. The multiple quantum well wave guide layer 11 grown in the first and second selective growth areas sandwiched between the first and second stripe masks 7 and 8 respectively has the mesa structure. In the mask free regions or in the Mach-Zehnder optical modulator region 102 and the passive wave guide region 103, the multiple quantum well wave guide layer 11 has a flat structure.

The first and second dielectric stripe masks 7 and 8 are subjected to a selective etching so that inside portions thereof are removed thereby the gap width thereof becomes wide up to 6 micrometers. A p-InP cladding layer 12 is subsequently grown on the multiple quantum well wave guide layer 11 by the selective metal organic vapor phase epitaxy with use of the selectively-etched first and second dielectric stripe masks 7 and 8. The p-InP first cladding layer 12 grown in the first and second selective growth areas sandwiched between the first and second stripe masks 7 and 8 respectively has the mesa structure and a constant width of 6 micrometers. In the mask free regions or in the Mach-Zehnder optical modulator region 102 and the passive wave guide region 103, the p-InP first cladding layer 12 has a flat structure.

After the selective growth of the multiple quantum well wave guide layer 11, the first and second dielectric stripe masks 7 and 8 are removed. A third dielectric stripe mask pattern, not illustrated, is selectively provided in the entire regions 100, 101, 102, 103 and 104. The third stripe mask pattern sandwiches and defines a third selective growth area. The third selective growth area comprises four straight portions on the every first to fourth channels in the active and distributed Bragg reflector regions 100 and 101, four sets of 2-divisional portions on the every first to fourth channels in the Mach-Zehnder optical modulator region 102, four bending portions with a star coupler portion in the passive wave guide region 103 and a single straight portion in the optical amplifier region 104. The third dielectric stripe masks has constant mask width and gap width in the every regions 100, 101, 102 and 104.

A p-InP second cladding layer 14 is selectively grown on the p-InP first cladding layer 12 by the metal organic vapor phase epitaxy with use of the third dielectric stripe mask pattern. The p-InP second cladding layer comprises four straight portions on the every first to fourth channels in the active and distributed Bragg reflector regions 100 and 101, four sets of 2-divisional portions on the every first to fourth channels in the Mach-Zehnder optical modulator region 102, four bending portions with a star coupler portion in the passive wave guide region 103 and a single straight portion in the optical amplifier region 104. The p-InP second cladding layer 14 has the ridge or mesa structure. A p-cap layer and a p-side electrode are selectively formed in turn in the regions except in the mask free regions 102 and 103. An n-side electrode is provided on a bottom of the n-InP semiconductor substrate 6.

A measured threshold current of the distributed Bragg reflector laser 1 is about 20 mA. The distributed Bragg reflector laser 1 shows a light output power of 10 mW and a tunable range of 5 nanometers. The Mach-Zehnder optical modulator 2 is performed by 3.5 V to show an extinction ratio of about 15 dB. A total loss of the Mach-Zehnder optical modulator 2, the passive wave guide 3 and the star coupler 4 is about 20 dB which is readily able to be compensated by the light intensity amplification by the optical amplifier 5 thereby a value of +8 dB in a light output from each channel is obtained. The optical integration device may be useful as a high speed multiple wavelength optical communication system at 10 Gb/s in which a multi-channel wavelength pitch of the distributed Bragg reflector lasers is 4 nanometers. The simplicity of the fabrication process free from any etching process is able to provide a high yield and a uniformity in the device performances.

Figure 43:
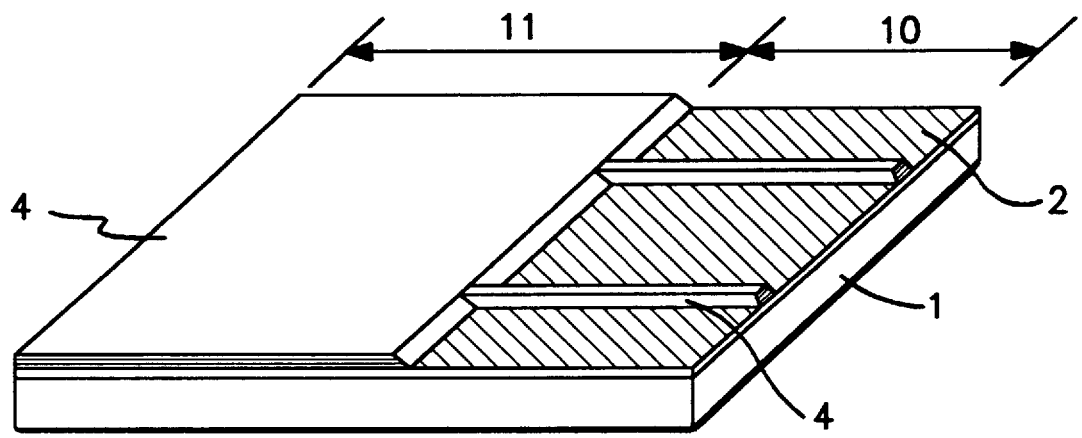
FIGS. 43 and 44 are perspective views illustrative of optical integration devices in two fabrication steps involved in a fabrication method of a thirteenth embodiment according to the present invention.
Figure 44:
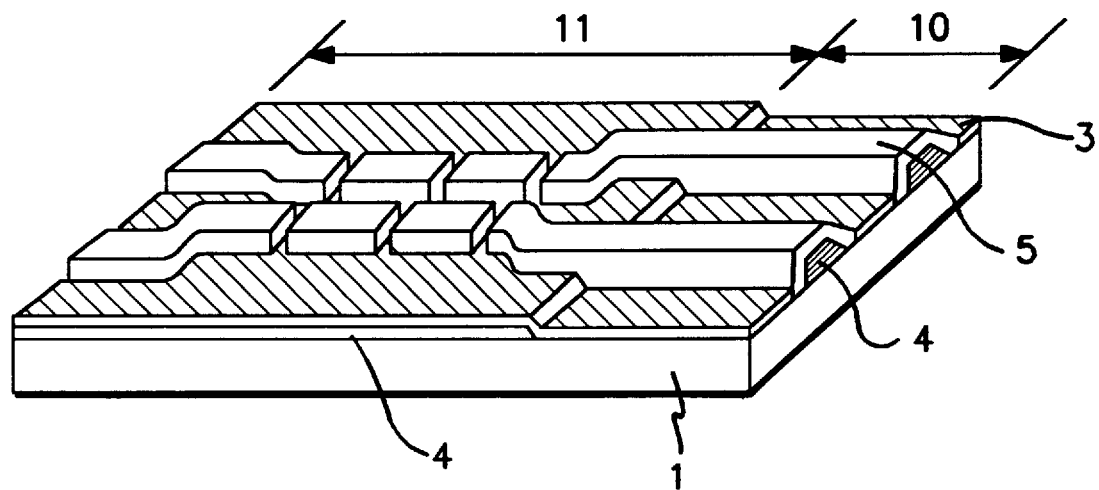

A thirteenth embodiment according to the present invention is directed to a novel fabrication process of an optical integration device including wavelength tunable distributed feedback lasers and a directional coupler optical switch. An n-InP semiconductor substrate 1 comprises a distributed feedback laser region 10 and a directional coupler optical switch region 11. Longitudinal length in the wave guide direction of the distributed feedback laser region 10 and the directional coupler optical switch region 11 are 400 micrometers and 2000 micrometers respectively. A first-order corrugation grating with a constant pitch is formed in the distributed feedback laser region 10. As illustrated in FIG. 43, a first dielectric mask pattern 2 is selectively provided in the distributed feedback laser region 10. A non-doped multiple quantum well layer 4 is selectively grown on the n-InP semiconductor substrate 1 by a selective metal organic vapor phase epitaxy with use of the first dielectric mask pattern 2. The multiple quantum well layer 4 comprises i-InGaAs well layers and i-InGaAsP barrier layers. In the distributed feedback laser region 10, the multiple quantum well layer 4 is selectively formed on first selective growth areas sandwiched or defined by the first dielectric mask pattern 2. The first selective growth areas are slender areas with a width of 1.5 micrometers and arranged in parallel to each other along the wave guide direction. In the directional coupler optical switch region 11, the multiple quantum well layer 4 is grown in the entire of the region 11. The multiple quantum well layer 4 has the mesa structure in the distributed feedback laser region 10 and flat structure in the directional coupler optical switch region 11. The multiple quantum well layer has different wavelength compositions between in the distributed feedback laser region 10 and in the directional coupler optical switch region 11. A wavelength composition of the flat portion in the directional coupler optical switch region 11 is 1.38 micrometers. A wavelength composition of the mesa structure portion in the distributed feedback laser region 10 is 1.55 micrometers.

After removing the first dielectric mask pattern 2, a second dielectric mask pattern 3 is selectively formed on the multiple quantum well layer 4 and the semiconductor substrate 1 in the distributed feedback laser region 10 and the directional coupler optical switch region 11. A p-InP cladding layer 5 is selectively grown by a metal organic vapor phase epitaxy with use of the second dielectric mask pattern 3. In the distributed feedback laser region 10, the p-InP cladding layer 5 is grown to cover and embed the mesa structure multiple quantum well layer 4. In the directional coupler optical switch region 11, the p-InP cladding layer 5 is grown on the flat structure of the multiple quantum well layer 4. The p-InP cladding layer 5 has a width of 8 micrometers in the distributed feedback laser region 10 and a width of 4 micrometers in the directional coupler optical switch region 11. In the region 11, a directional coupler optical switch with a ridged structure is formed. A p-cap layer and a p-side electrode are selectively formed in turn on the pInP cladding layer 5. An n-side electrode is provided on a bottom of the n-InP semiconductor substrate 1. Additionally, heating resistance wires of Pt may be provided to the distributed feedback lasers.

A tunable wavelength range of about 4 nanometers is obtained with a controlled Pt resistance wire current of several ten mA. The distributed feedback laser of resistance heating type has a wavelength switching time of few ms. The distributed feedback lasers are designed to show laser emissions of different wavelengths in which difference in frequency is about several ten GHz. In this case, a high speed switching performance at a switching time of about 1 ns is obtained with applying a voltage to the directional coupler optical switch. The simplicity of the fabrication process free from any etching process is able to provide a high yield and a uniformity in the device performances.

The novel fabrication process of the present invention is of course able to applied to any optical integration devices other than those described and illustrated in the above first to thirteenth embodiments. It is available to modify each element involved in the optical integration device.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications which fall within the spirit and scope of the invention.

What is claimed is:

1. A method of fabricating an optical monolithic-integrated semiconductor device on a semiconductor substrate having active and passive regions, said method comprising the steps of:

providing a first mask material only in said active region, said first mask material varying in width, and defining a first selective growth area in said active region;

growing epitaxial layers including a multiple quantum well structure by a metal organic vapor phase epitaxy using said first mask material, so that said epitaxial layers are grown selectively on said first selective growth area in said active region and simultaneously grown non-selectively on an entire surface of said passive region, said epitaxial layers having variations in their band gap energy and thickness in a wave-guide direction, said quantum well structure in said active region having varied band gap energies which are smaller than a band gap energy of said quantum well structure in said passive region, said epitaxial layers having a mesa structure in said active region and having a plane structure in said passive region;

removing said first mask material;

providing a second mask material which remains unchanged in its width over said active and passive regions, said second mask material defining a second selective growth area over said active and passive regions; and growing a cladding layer with a ridged structure by a metal organic vapor phase epitaxy on an entire surface of said second selective growth area, so that in said active region said ridged structure of said cladding layer completely embeds said mesa structure of said mesa epitaxial layers, and so that in said passive region, said ridged structure of said cladding layer is placed on said plane structure of said epitaxial layers.

2. The method as claimed in claim 1, further comprising the step of providing a first electrode on a bottom surface of said semiconductor substrate and selectively providing a second electrode on a top surface of said ridged structure of said cladding layer in said active region.

3. The method as claimed in claim 1, wherein said multiple quantum well structure is grown at a highest growth pressure relative to all other growth pressures in said metal organic vapor phase epitaxy.

4. The method as claimed in claim 3, wherein said multiple quantum well structure is grown at a growth pressure greater than 150 Torr.

5. The method as claimed in claim 1, further comprising the step of forming a first-order grating with a constant pitch on a part of said semiconductor substrate prior to said first step.

6. The method as claimed in claim 5, wherein said first mask material over said first-order grating defines multiple channels in said first selective growth area, and further differs in its width in each of said multiple channels.

7. The method as claimed in claim 1, further comprising the steps of:

forming an optical guide layer with a plane structure on an entire surface of said semiconductor substrate prior to said first step; and forming a spacer layer with a plane structure on said optical guide layer.

8. A method for fabricating an optical monolithic-integrated semiconductor device on a semiconductor substrate having active and passive regions, said method comprising the steps of:

providing a first mask material only in said active region, said first mask material remaining unchanged in its width and defining a first selective growth area in said active region;

growing epitaxial layers including a multiple quantum well structure by a metal organic vapor phase epitaxy using said first mask material, so that said epitaxial layers are grown selectively on said first selective growth area in said active region and simultaneously grown non-selectively on an entire surface of said passive region, said epitaxial layers having variations in their band gap energy and thickness in a wave-guide direction, said quantum well structure in said active region having a smaller band gap energy than a band gap energy of said quantum well structure in said passive region, said epitaxial layers having a mesa structure in said active region and having a plane structure in said passive region;

removing said first mask material;

providing a second mask material over said active and passive regions, said second mask material defining a second selective growth area over said active and passive regions; and growing a cladding layer with a ridged structure by a metal organic vapor phase epitaxy on an entire surface of said second selective growth area, so that, in said active region, said ridged structure of said cladding layer completely embeds said mesa structure of said mesa epitaxial layers, and so that, in said passive region, said ridged structure of said cladding layer is placed on said plane structure of said epitaxial layers.

9. The method as claimed in claim 8, wherein said second mask material remains unchanged in its width over said active and passive regions.

10. The method as claimed in claim 8, wherein said second mask material varies in its width between said active and passive regions.

11. The method as claimed in claim 8, further comprising the step of providing a first electrode on a bottom surface of said semiconductor substrate and selectively providing a second electrode on a top surface of said ridged structure of said cladding layer in said active region.

12. The method as claimed in claim 8, wherein said multiple quantum well structure is grown at a highest growth pressure relative to all other growth pressures in said metal organic vapor phase epitaxy.

13. The method as claimed in claim 12, wherein said multiple quantum well structure is grown at a growth pressure greater than 150 Torr.

14. The method as claimed in claim 8, further comprising the step of forming a first order grating with a constant pitch on a part of said semiconductor substrate prior to said first step.

15. The method as claimed in claim 14, wherein said first mask material over said first-order grating defines multiple channels in said first selective growth area, and further differs in its width in each of said multiple channels.

16. The method as claimed in claim 8, further comprising the steps of:

forming an optical guide layer with a plane structure on an entire surface of said semiconductor substrate prior to said first step; and forming a spacer layer with a plane structure on said optical guide layer.

17. A method for fabricating an optical monolithic-integrated semiconductor device on a semiconductor substrate having active and passive regions, said method comprising the steps of:

providing a first mask material only in said active region, said first mask material defining a first selective growth area in said active region;

growing epitaxial layers including a multiple quantum well structure by a metal organic vapor phase epitaxy using said first mask material, so that said epitaxial layers are grown selectively on said first selective growth area in said active region and simultaneously grown non-selectively on an entire surface of said passive region, said epitaxial layers having variations on their band gap energy and thickness in a wave-guide direction, said quantum well structure in said active region having a smaller band gap energy than a band gap energy of said quantum well structure in said passive region, and said epitaxial layer having a mesa structure in said active region and having a plane structure in said passive region;

removing said first mask material;

providing a second mask material over said active and passive regions, said second mask material defining a second selective growth area only on said active region;

selectively growing a first cladding layer with a ridged structure by a metal organic vapor phase epitaxy on said second selective growth area, so that, in said active region, said ridged structure of said cladding layer completely embeds said mesa structure of said mesa epitaxial layers;

removing said second mask material;

providing a third mask material over said active and passive regions, said third mask material defining a third selective growth area only on said passive region; and selectively growing a second cladding layer with a ridged structure by a metal organic vapor phase epitaxy on said third selective growth area, so that, in said passive region, said ridged structure of said cladding layer is placed on said plane structure of said epitaxial layers.

18. The method as claimed in claim 17, wherein said second mask material remains unchanged in its width over said active region.

19. The method as claimed in claim 17, wherein said third mask material remains unchanged in its width over said passive region.

20. The method as claimed in claim 17, wherein said second mask material differs in its width from that of said third mask width.

21. The method as claimed in claim 17, further comprising the step of providing a first electrode on a bottom surface of said semiconductor substrate and selectively providing a second electrode on a top surface of said ridged structure of said cladding layer in said active region.

22. The method as claimed in claim 17, wherein said multiple quantum well structure is grown at a highest growth pressure relative to all other growth pressures in said metal organic vapor phase epitaxy.

23. The method as claimed in claim 22, wherein said multiple quantum well structure is grown at a growth pressure greater than 150 Torr.

24. The method as claimed in claim 17, further comprising the step of forming a first order grating with a constant pitch on a part of said semiconductor substrate prior to said first step.

25. The method as claimed in claim 23, wherein said first mask material over said first-order grating defines multiple channels in said first selective growth area, and further differs in its width in each of said multiple channels.

26. The method as claimed in claim 17, further comprising the steps of:

forming an optical guide layer with a plane structure on an entire surface of said semiconductor substrate prior to said first step; and forming a spacer layer with a plane structure on said optical guide layer.

27. A method for fabricating an optical monolithic-integrated semiconductor device on a semiconductor substrate having a grating region on which a grating is formed and a non-grating region on which no grating is formed, said method comprising the steps of:

providing plural sets of first mask materials over said grating and non-grating regions so that said plural sets of said first mask materials respectively define a plurality of channel regions parallel to each other and including a part of said grating region, wherein on said grating region, at least one set of said first mask materials differs in its width from the other sets of said first mask materials while said first mask materials on said non-grating region does not differ in its width between every set of said first mask materials;

growing epitaxial layers including a multiple quantum well structure by a metal organic vapor phase epitaxy using said first mask material, so that said epitaxial layers are grown selectively on said plurality of channel regions, and so that on said grating region at least one epitaxial layer defined by said at least one set of said first mask materials differs in its band gap energy and thickness from the other epitaxial layers defined by the other sets of said first mask materials, said epitaxial layers having a mesa structure;

removing said first mask material;

providing second mask materials which remain unchanged in its width over said grating and non-grating regions, said second mask materials having said epitaxial layers interposed between them; and growing cladding layers with a ridged structure by a metal organic vapor phase epitaxy, so that said cladding layers cover said epitaxial layers.

28. The method as claimed in claim 27, wherein on said grating region said first mask materials differ in its width for every channel.

* * * * *